United States Patent [19]
Hart et al.

[11] 4,056,810
[45] Nov. 1, 1977

[54] INTEGRATED INJECTION LOGIC MEMORY CIRCUIT

[75] Inventors: Cornelis Maria Hart; Arie Slob, both of Eindhoven, Netherlands

[73] Assignee: U.S. Phillips Corporation, New York, N.Y.

[21] Appl. No.: 653,131

[22] Filed: Jan. 28, 1976

Related U.S. Application Data

[60] Division of Ser. No. 505,663, Sept. 13, 1974, which is a continuation of Ser. No. 253,348, May 15, 1972, abandoned.

[30] Foreign Application Priority Data

May 22, 1971 Netherlands .................... 7107040

[51] Int. Cl.² .................. G11C 11/40; G11C 13/00
[52] U.S. Cl. .................................. 365/205; 365/156; 365/181
[58] Field of Search ............... 340/173 FF, 173 R

[56] References Cited
U.S. PATENT DOCUMENTS 3,801,967  4/1974  Berger ..................... 340/173 LI Primary Examiner—Terrell W. Fears
Attorney, Agent, or Firm—Frank R. Trifari; Daniel R. McGlynn

[57] ABSTRACT

A new integrated circuit in which bias currents are supplied by means of a current injector, a multi-layer structure in which current is supplied, by means of injection and collection of charge carriers via rectifying junctions, to zones to be biased of circuit elements of the circuit, preferably in the form of charge carriers which are collected by the zones to be biased themselves from one of the layers of the current injector. By means of said current injector circuit arrangements can be realized without load resistors being necessary, while the wiring pattern may be very simple and the packing density of the circuit elements may be very high. In addition a simple method of manufacturing with comparatively few operations can in many cases be used in particular upon application of transistors having a structure which is inverted relative to the conventional structure.

8 Claims, 23 Drawing Figures

INTEGRATED INJECTION LOGIC MEMORY CIRCUIT

REFERENCE TO RELATED APPLICATIONS

This is a division of application Ser. No. 505,663 filed Sept. 13, 1974 which was a continuation of application Ser. No. 253,348 filed May 15, 1972 and now abandoned. Ser. No. 253,348 has been continued in copending application Ser. No. 674,065 filed Apr. 5, 1976. Copending application Ser. No. 653,472 filed Jan. 29, 1976 is also a division of application Ser. No. 505,663 filed Sept. 13, 1974.

The invention relates to an integrated circuit comprising several circuit elements which are arranged beside each other on one side of a body which is common to said circuit elements, semiconductor zones of said circuit elements being connected to a pattern of conductive tracks present on the said one side of the body for the electric connection of the said circuit elements, said pattern having at least one input and at least one output for electric signals, the body furthermore comprising connections for connecting the two polarities of a source for supplying bias current to one or more of the circuit elements.

The common body of such an integrated circuit may consist, for example, mainly of insulating material on which one or more semiconductor regions are provided or in which a number of such regions are embedded. However, the common body usually consists substantially entirely of a semiconductor material. In, and in certain cases also entirely or partly on, such a semiconductor body which usually is monocrystalline, circuit elements, for example diodes, transistors, resistors and capacities, are realized with semiconductor regions having different electric properties, p-n junctions, Schottky junctions, insulating and conductive layers, and so on, which elements are connected to form a circuit by means of a pattern of conductive tracks.

When the number of circuit elements per integrated circuit increases, a number of problems present themselves. For example, the yield in the manufacture strongly depends upon the size of the semiconductor surface area required for the circuit in that sense that when said surface area increases, the yield decreases. Furthermore, the dimensions of the circuit elements themselves influence their high-frequency behaviour. For example, the cut-off frequency generally is smaller according as the dimensions of the relevant circuit element are larger. Also for these reasons it is desirable to reduce the dimensions of the semiconductor regions of the circuit elements as much as possible and to simplify the technology for the manufacture, if possible.

Another problem is the admissible dissipation. Reducing the dissipation and hence the energy consumption of the circuit, which reduction is not at the cost of the ready functioning and/or the cost-price of the integrated circuit, increases the application possibilities of such circuits. However, other criteria may also play an important part with respect to the dissipation. For example, in the case of large and complex integrated circuits the overall dissipated energy may be so large that stringent requirements are imposed upon the cooling of the common body so as to be able to keep the maximum temperature below a value at which a reliable operation of the circuit is not yet endangered. Furthermore, for example in battery-operated circuits, the desirability exists, in connection with the life of the batteries, to use circuits having a small dissipation.

The desirability of small dissipation generally leads to the use of load resistors for the transistors in the circuit which have a high resistance value. However, such high-value resistors require comparatively much semiconductor surface area as a result of which, as already described above, the yield in the manufacture is adversely influenced and/or the number of circuit elements per integrated circuit becomes relatively smaller.

Also in connection with the above-mentioned contradictory requirements it has already been proposed to replace in such integrated circuits the load resistors by complementary transistors which are provided in the common body so as to be insulated from the remaining transistors.

If in this or another manner, for example, a compromise has been found between the semiconductor surface area required for the circuit elements and the admissible dissipation, a further problem may be that when the number of circuit elements increases, a situation can be reached in which no longer the circuit elements themselves but the pattern of conductive tracks required for inter-connecting and electric biasing of said circuit elements including the supply tracks is decisive or at least also decisive of the required surface area.

It is to be noted that bias currents are to include all those currents which are supplied to the circuit elements for the direct current biasing thereof. A number of these currents, usually those currents which flow through the main current path of the relevant circuit element via the main electrodes, for example the emitter and the collector of a transistor, also supply energy which may be used for signal amplification — the ratio between the energies of the output signal and the input signal. "Supply tracks" are to be understood to mean tracks which serve notably to supply the last-mentioned bias currents.

A part of the pattern of conductive tracks is formed by the connections which are necessary for the electric biasing of the circuit elements. In the operating condition, comparatively much current flows in particular through the supply tracks, in which tracks usually substantially no voltage loss may occur. As a result of this, in particular the supply tracks are often constructed to be comparatively wide in the conventional integrated circuits. Furthermore, in substantially any place in the circuit, bias currents have to be supplied to circuit elements at a result of which the relevant tracks usually have a considerable length. So the supply tracks required for the biasing of the circuit elements require a considerable part of the space available for the pattern as a result of which the realization of the remaining conductive connections within a restricted space is impeded also because crossing connections are preferably avoided. Indeed, this problem does not only occur with very large integrated circuits but also in circuits having a smaller number of circuit elements, albeit sometimes in a less serious form.

In Dutch Patent Application No. 6,800,881 laid open to public inspection on July 24, 1968, an integrated circuit is described in which conductive tracks at the surface for supplying bias current are avoided as much as possible. This integrated circuit does not have a p-type semiconductor substrate, as is usual, but an n-type semiconductor substrate. On this n-type substrate is then grown epitaxially first a p-type layer and then an n-type layer. The circuit elements are provided in the epitaxial n-type layer in the same manner as in conventional integrated circuits, the function of the p-type epitaxial layer, at least in an electric respect, being comparable to that of the conventional p-type substrate. During operation the negative polarity of the external voltage source is connected to the p-type layer and the positive polarity is connected to the n-type substrate. A direct conductive connection is provided between the n-type substrate and one or more parts and the n-type epitaxial layer in that, prior to growing the epitaxial n-type layer, the conductivity type of the p-type layer in the relevant places has been converted into n-type by diffusion. In this manner, the two polarities of the voltage source are available substantially in any desirable location at the semiconductor surface via a direct low-ohmic conductive connection. However, the manufacture of said circuits is considerably more complicated than that of the more conventional integrated circuits as a result of the extra epitaxial p-type layer and the extra diffusion treatment for the conductive connections between the n-type substrate and the n-type epitaxial layer.

It is the object of the invention to provide new routes for the integration of circuits. It is based inter alia on the recognition of the fact that the mechanism which has long been known per se to occur in transistors and in which current can be transmitted via an intermediate layer by injecting, via a first junction, charge carriers in the intermediate layer, which carriers are collected from the intermediate layer via a second junction, can be used in a multilayer structure, termed current injector, for supplying bias current to circuit elements of an integrated circuit in a manner different from the manner hitherto known and that the current injector in relation to the circuit elements to be supplied by the current injector can be incorporated in the integrated circuit, in which either for an electric connection of the current injector the readily admissible side of the body which is common to the circuit elements and which side is present opposite to the one side where the said pattern of conductive tracks is present is used, or the current injector is combined with one or more circuit elements to be biased so that they have at least a common zone, in such manner that a considerable simplification in structure, a greater compactness, a simplified wiring pattern and even a renovation in the structure of the integrated circuits with associated technological and electrical advantages, for example separation of the supply inputs from the signal inputs, become possible.

According to the invention, an important characteristic feature of integrated circuits of the type described in the preamble is that the common body comprises a current injector for supplying bias current, said current injector being a multilayer structure having at least three successive layers which are separated from each other by rectifying junctions among which a first — termed injecting layer — which is separated from the circuit elements to be adjusted by at least one rectifying junction, and an adjoining second layer of a semiconductor material — termed intermediate layer —, the injecting layer having a connection for one polarity of the said source and the intermediate layer having a connection for the other polarity of the said source to polarize the rectifying junction between the injecting layer and the intermediate layer in the forward direction, to inject charge carriers from the injecting layer into the intermediate layer which are collected by the third layer of the current injector adjoining the intermediate layer — termed collecting layer —, the said current injector being used, according to one or more of the aspects of the invention to be described hereinafter, in very close relationship with the circuit element to be biased as regards location and distance.

According to a first aspect of the invention, an integrated circuit of the type described in the preamble in which, according to the invention, a current injector is incorporated is furthermore characterized in that a zone of one of the circuit elements — termed zone to be biased — which is separated from the injecting layer and hence from the one source connection connected thereto by at least two rectifying junctions, collects, across a rectifying junction bounding said zone, charge carriers from one of the layers of the current injector and thus receives bias current, said zone being directly connected to the pattern of conductive tracks.

In this manner said current injector is combined with at least the said one circuit element to form a compact assembly in which by means of injection of charge carriers across a rectifying junction which is polarized in the forward direction and essentially does not belong to the one circuit element, a flow of charge carriers which forms the bias current required for the zone to be biased is supplied to said zone. It is of particular importance that no connection of the zones to be biased to the pattern of conductive tracks is necessary for supplying bias current. This is one of the reasons why said pattern of conductive tracks becomes simpler. Furthermore, the said electric biasing obtained by means of the current injector is in the form of supplying current, as a result of which the use of resistors becomes substantially superfluous. In addition to the bias current supplied by means of the current injector, electric signals may, if desirable, be supplied to or derived from the zone to be biased via the pattern of conductive tracks.

The zones to be biased of the circuit elements may belong to main electrodes, for example the emitter and the collector of a transistor, but they may also belong to control electrodes of the circuit elements in question.

According to a second aspect of the invention, the said current injector is combined with at least one of the circuit elements to form a particularly compact assembly. An integrated circuit according to said second aspect of the invention comprises a current injector, the zone to be biased of the one circuit element collecting charge carriers from one of the layers of the current injector as described above, and said integrated circuit being furthermore characterized in that the last-mentioned one layer of the current injector also forms a further zone of the one circuit element, the zone to be biased being directly connected to a further part of the integrated circuit, for example, the pattern of conductive tracks and/or further circuit elements.

This embodiment is particularly suitable for the electric biasing of control electrodes, for example the base zones of transistors.

According to a third aspect of the invention which, if desirable, may also be combined with the preceding aspects, the current injector is constructed to be lateral, that is to say having the layers of the current injector beside each other and adjoining the said one side of the body. In this lateral embodiment the charge carriers carrying the bias current experience a displacement in the lateral direction, so approximately parallel to one side of the body.

An integrated circuit according to said third aspect of the invention comprises a current injector as described above which is characteristic of the integrated circuit according to the invention and is furthermore characterized in that a zone of one of the circuit elements — termed zone to be biased — which is separated from the injecting layer and hence from the one source connection connected thereto by at least two rectifying junctions, and those layers of the current injector which have the same conductivity type as the zone to be biased are surface zones of one conductivity type which extend beside each other from the said side of the body in the same region of the opposite conductivity type and are surrounded in the body in said region, and the zone to be biased forms with the region a junction bounding said zone, via which junction said zone collects charge carriers from the region and thus receives bias current, which charge carriers are injected in the region from a layer of the current injector constituting a rectifying junction with the region and being located on the said one side of the body.

With this lateral embodiment also the pattern of conductive tracks, as will be described in detail below, can be considerably simplified while said embodiment particularly offers furthermore, as will become apparent, a possibility for integrating circuits with the aid of a considerably simplified technology.

According to a fourth aspect of the invention which, if desirable, may be combined with the first or the second aspect, the current injector is constructed to be vertical. An integrated circuit according to said fourth aspect of the invention comprises a current injector as described above which is characteristic of the integrated circuit according to the invention and is furthermore characterized in that the injecting layer adjoins the side of the body located opposite to the said one side and a layer to the current injector — termed oppositely located layer — which is separated from the injecting layer and hence from the one source connection connected thereto by at least two rectifying junctions, and extends on the said one side of the body and opposite to the injecting layer, while the oppositely located layer can collect charge carriers from an adjacent layer of the current injecting through a rectifying junction bounding said layer and thus receives a current which serves as a bias current for a zone of one of the circuit elements — hereinafter termed zone to be biased — which zone to be biased is connected to the oppositely located layer.

Such a vertical embodiment enables current to become available in the desirable locations on said one side without this requiring long conductive tracks on the said one side of the common body. This bias current is supplied by means of a source connection on the oppositely located side of the body and a junction polarized in the forward direction.

In this manner also, a simplification of the pattern of conductive tracks is inter alia obtained.

The injecting layer of the current injector can be formed, for example, by a metal layer which is separated from the semiconductor intermediate layer by a thin insulating layer, charge carriers being introduced into the intermediate layer by injection by tunneling. However, the injecting layer preferably is a semiconductor layer which forms a p-n junction with the intermediate layer.

A preferred embodiment of the integrated circuit according to the invention which provides a particularly simple construction is that in which the current injector is a three-layer structure in which the injecting layer and the collecting third layer are semiconductor layers of one conductivity type and the intermediate layer is of the opposite conductivity type, the zone to be biased belonging to the collecting third layer of the current injector.

It is to be noted that the collecting layer, and in general any layer of the current injector which collects charge carriers from an adjacent layer of the current injector if no external potential is impressed, will assume a potential at which the rectifying junction between the two relevant layers is polarized in the forward direction. As a result of this, injection of charge carriers will also occur across said collecting junction. If an equal amount of current flows across the collecting junction in both directions, the voltage across said junction will be maximum and substantially equal to the voltage across the injecting junction of the current injector. In all the other cases the value of the forward voltage depends upon the value of the (bias) current derived by or from the relevant collecting layer. It will be obvious that in the boundry case in which substantially no voltage exists across the relevant collecting rectifying junction, the derived current is maximum.

By means of the current injector and via the supply of bias current, biasing potentials for the zone to be biased can thus be obtained the value of which lies in a range which is restricted by the voltage between the two source connections of the current injector connected to a source. The bias potentials obtained by means of the current injector are maximally equal to those of the source connection with the highest potential and minimum equal to those of the source connection with the lowest potential. Furthermore, the voltage between the source connections is equal to the voltage which is necessary to operate the rectifying junction between the injecting layer and the intermediate layer in the forward direction. This voltage will generally be comparatively low. A usual value for said forward voltage for a p-n junction in silicon, for example, is approximately 0.6 to 0.8 Volt. It is particularly attractive that in many cases the whole circuit can be operated at the above-described low voltages as a result of which the dissipation can be extremely low. This advantage of low dissipation is also considerably realized if an important part of the circuit is operated at said low voltages beside, for example, one or more output transistors to which higher voltages are supplied so as to have a higher power available at the output(s) of the circuit.

It is to be noted in this connection that by means of the current injector, bias current can also be supplied to zones of circuit elements which are operated at voltages higher than those indicated above. In that case the potential of the zone to be biased which is connected to the current injector may lie outside the above-indicated range namely so that the rectifying junction between the zone to be biased and the adjoining layer of the current injector is polarized in the reverse direction.

The number of layers of the current injector may be both even and odd. In an important embodiment of the integrated circuit according to the invention the current injector is a five-layer structure in which the fourth layer of the current injector adjoining the collecting third layer is a semiconductor layer of the same conductivity type as the intermediate layer, in which the third layer injects charge carriers into the fourth layer and the fifth layer collects charge carriers from the fourth layer through a rectifying junction bounding said fifth layer and thus receives a current which serves as a bias current for the zone to be biased of the one circuit element.

In this embodiment, the intermediate layer and the fourth layer of the current injector can advantageously form a continuous region of the same conductivity type in the body.

In a further embodiment of the integrated circuit according to the invention the current injector comprises means for controlling the bias current to be received by the zone to be biased. In this manner the bias current can be varied between zero and a value which is determined by the voltage set up at the source connections of the current injector, or be adjusted at a desirable level. In a five-layer current injector, said control or adjustment can simply be realized by means of an at least temporarily conducting connection between the collecting third layer and a layer adjoining said third layer of the current injector. Such a connection may comprise, for example, an electronic switch such as a transistor.

The bias current to be supplied by means of the current injector may be supplied, for example, to a diode. However, a circuit element to be biased preferably is a transistor having at least two main electrodes and at least one control electrode, for example a field effect transistor having a source and drain zone and one or more gate electrodes. When bipolar transistors are used in the circuit it is of particular advantage to supply bias current to the base zones of one or more of the transistors by means of the current injector. If the current injector is combined with the transistor, the layer of the current injector which adjoins the base zone to be biased and from which the base zone collects charge carriers may form the emitter zone or the collector zone of the transistor in question. Particularly in the first-mentioned case, circuit arrangements of a particularly simple construction can be realized. The circuit then preferably comprises a number of transistors in a common emitter arrangement in which the various base zones to be biased collect charge carriers from the same layer of the current injector, said layer forming a common emitter zone of the transistors. So in this manner bias current is simultaneously supplied to several circuit elements by means of one current injector. When the current injector is constructed to be vertical, the common emitter zone may form a reference potential plane for the circuit or for a part thereof, said plane separating the circuit elements from the injecting layer and the source connection connected thereto. Furthermore, multi-collector transistors may be used in the common emitter circuit, as a result of which the compactness of the circuit and the simplicity of the wiring pattern can be considerably improved.

In an important embodiment of the integrated circuit in which the base zones of several transistors are provided with bias current by means of a single injecting layer and a single intermediate layer, the collector of a first of the transistors is connected, via the pattern of conductive tracks, to the base of a second transistor. This cascade arrangement can extremely readily by used in circuits for low power and/or linear amplification, for example for hearing aids, or in logic circuits, such as NOR gates. In this case it is of particular importance that the bias current supplied to the base zone of the second transistor can serve, simultaneously or shifted relative to each other in time, as a base current for the second transistor and as a collector supply current for the first transistor.

Integrated circuits having such cascades can be manufactured with a strongly simplified technology while in particular logic circuits with such cascades have a considerably simplified wiring pattern because both the bias current for the control electrodes and the supply current for the main electrodes can be supplied by the current injector.

In addition, this manner of current supply makes the use of load resistors usually superfluous also as a result of which a NOR gate having several inputs may consist, for example, simply of a number of transistors having a common emitter zone the collector-emitter paths of which are connected in parallel by the interconnection of the collectors.

For example, integrated trigger circuits having cross-coupled transistors with a common emitter zone can also be obtained easily. Such trigger circuits constructed according to the invention require comparatively little semiconductive surface area and have a simple wiring pattern and a low dissipation as a result of which they are particularly attractive for use as matrix elements in large memories.

In order that the invention may be readily carried into effect, a few examples thereof will now be described in greater detail with reference to the accompanying drawings, in which FIG. 1 is a diagrammatic plan view of a part of a first embodiment of the integrated circuit according to the invention.

FIG. 9 is a diagrammatic cross-sectional view of a fourth embodiment of the integrated circuit according to the invention, while

FIG. 13 is a diagrammatic cross-sectional view of that part of the fifth embodiment of which FIG. 11 shows the associated circuit diagram.

FIG. 16 is a diagrammatic plan view of a part of a seventh embodiment of the integrated circuit according to the invention, of which

FIG. 19 shows a circuit diagram associated with a ninth embodiment of the integrated circuit according to the invention and of a part of which

FIG. 21 shows a circuit diagram associated with a tenth embodiment of the integrated circuit according to the invention of a part of which FIG. 22 is a diagrammatic plan view, while

Figure 1:
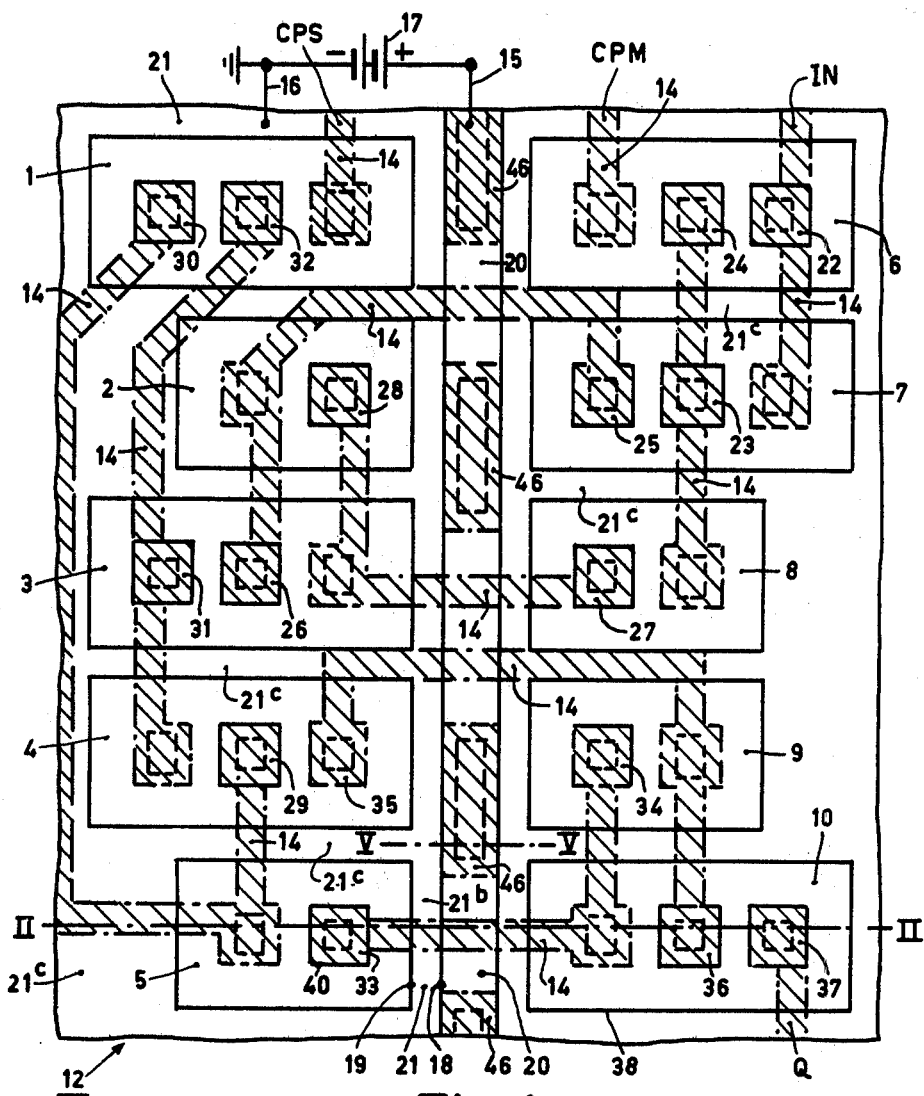
Figure 2:
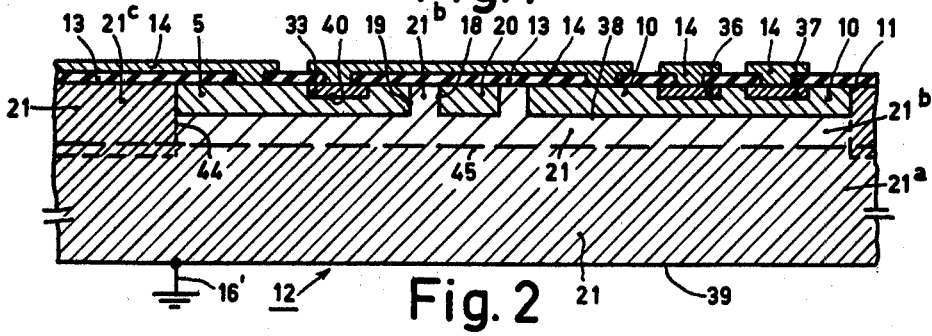
FIG. 2 is a diagrammatic cross-sectional view of the embodiment shown in FIG. 1 taken on the line II—II of FIG. 1.

FIGS. 1 and 2 show a part of a first embodiment of the integrated circuit according to the invention. This integrated circuit comprises a plurality of circuit elements, in this case transistors, of which the base zones are denoted by reference numerals 1 to 10. These transistors are arranged beside each other on one side of a body 12 which is common to said circuit elements. The body 12 consists for the greater part of a semiconductor material and has on the side of the semiconductor surface 11 an insulating layer 13 across which extends a pattern of conductive tracks 14 which is present on said side of the body 12. The conductive tracks are connected, via apertures in the insulating layer 13 which in FIG. 1 are denoted by broken lines, to the parts of the circuit elements emerging at the semiconductor surface in said apertures. In this manner said tracks 14 serve for the electric connection of the transistors.

The body 12 furthermore comprises connections 15 and 16 shown diagrammatically in FIG. 1 for connecting the positive and the negative polarity of a source 17 for supplying bias current to one or more of the circuit elements.

According to the invention, the body 12 is provided with a current injector constituted by a multilayer structure having in this case three successive layers 20, 21 and 5 separated from each other by rectifying junctions 18 and 19. The first or injecting layer 20 is separated from the circuit elements to be biased by at least one rectifying junction, the junction 18. The second or intermediate layer 21 of the current injector is a semiconductor layer which constitutes the rectifying junctions 18 and 19, respectively, with the first and the third layer 20 and 5, respectively. The injecting layer 20 has a connection 15 for one polarity of the source 17 and the intermediate layer 21 has a connection 16 for the other polarity of the source 17. By means of this source 17, the rectifying junction 18 between the injecting layer 20 and the intermediate layer 21 is polarized in the forward direction, charge carriers being injected from the injecting layer 20 into the intermediate layer 21 and being collected by the third layer 5 of the current injector adjoining the intermediate layer 21.

The third layer of the current injector also forms the base zone to be biased of one of the transistors, namely of the three-layer transistors 33, 5, 21. This base zone 5 to be biased is separated from the injecting layer 20, and hence also from the source connection 15 connected thereto, by at least two rectifying junctions, the p-n junctions 18 and 19, and collects, via the junction 19 bounding the third zone 5, charge carriers from the intermediate layer 21 of the current injector which carriers provide the desirable bias current. Said zone 5 is furthermore connected to one of the tracks 14 of the conductor pattern, via which connection electric signals, for example, can be supplied or can be taken.

In the present embodiment, the bias currents of the remaining base zones 1 to 4 and 6 to 10 are supplied in a corresponding manner by means of the injecting layer 20 and the intermediate layer 21. The layers 20, 21 and 10, for example, constitute a current injector for supplying bias current to the base zone 10 of the three-layer transistor 36, 10, 21. This zone 10 to be biased is also separated from the injecting layer 20 and the one source connection 15 connected thereto by two rectifying junctions, the junctions 38 and 18. Said zone 10 furthermore collects charge carriers from the intermediate layer 21 of the current injector via the junction 38, the intermediate layer 21 also forming a zone of the circuit element, in this case one of the outermost zones of the three-layer transistor.

The base zone 10 to be biased of the transistor 36, 10, 21 is connected to a further three-layer transistor 37, 10, 21. This connection is realized internally in the semiconductor body 12 in that the zone 10 forms a base zone which is common to both transistors. In addition, the base zone 10 is also connected to one of the conductive tracks 14, which conductive track inter alia leads from the base zone 10 to the three-layer transistor 33, 5, 21.

The injecting layer 20 is a semiconductor layer of the same one conductivity type as the layers 1 to 10 which each constitute a third or collecting layer of the current injector. Said layers 1 to 10 and 20 extend beside each other from one side of the body at which the conductive pattern is present in the same region 21 of the opposite conductivity type and are surrounded by said region 21 in the body 12. The zones 1 to 10 to be biased receive their bias current by collecting charge carriers from the region 21, which carriers have been injected in the region 21 from a layer of the current injector present on the said one side, namely the injecting layer 20, via the rectifying junction 18.

Figure 3:
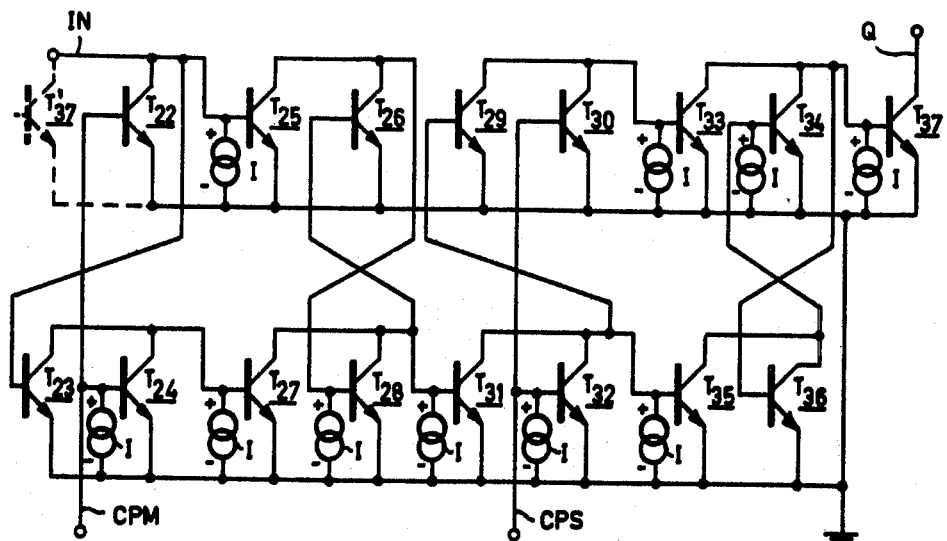
FIG. 3 shows an electric circuit diagram of the embodiment shown in FIG. 1 and 2.

The part of the integrated circuit according to the invention shown in FIGS. 1 and 2 constitutes a master slave flip-flop according to the electric circuit diagram shown in FIG. 3. Said flip-flop comprises 16 transistors $T_{22}$ to $T_{37}$ distributed over eight NOR gates having each two inputs. The collectors of said transistors $T_{22}$ to $T_{37}$ are referred to in FIGS. 1 and 2 by the corresponding reference numerals 22 to 37. The base zones of said transistors are the zones 1 to 10, the zones 1, 3, 4, 6, 7 and 10 each constituting a base zone which is common to two transistors. All the emitters of the transistors are connected together. They are constituted by the common emitter zone 21 which is also the intermediate layer of the current injector. The current injector with its collecting zones 1 to 10 to be biased is shown diagrammatically in FIG. 3 by ten current sources I. The diagram of FIG. 3 furthermore shows an electric input IN, an electric output Q and clockpulse connections CPM and CPS, respectively, for the master and the slave, the conductive tracks 14 corresponding thereto being denoted in the same manner in FIG. 1.

It is to be noted for clarity that the transistor $T_{37}$ in FIG. 3 actually does not belong to the flip-flop. In fact, the collector of the transistor $T_{34}$ constitutes an output of the flip-flop and transistor $T_{37}$ belongs already to a further gate circuit connected to said output of the flip-flop. Also lacking at the input of the integrated circuit shown is the transistor $T'_{37}$ shown in broken lines in FIG. 3 which may be considered to belong to the flip-flop and which together with the transistor $T_{22}$ constitutes a NOR input gate of the flip-flop. The cause of the fact that in the integrated form just the transistors $T_{22}$ to $T_{37}$ are grouped together as a structural unit is the connection shown between the bases of the transistors $T_{36}$ and $T_{37}$. Due to this connection, the transistor $T_{37}$ can actually be realized simply as an extra collector zone 37 in the base zone 10 of the transistor $T_{36}$ as a result of which a saving of required semiconductor surface area is obtained. For the same reason it is often also more favorable to construct the transistor $T'_{37}$ as an assembly with the part of the circuit immediately preceding the flip-flop, for example, a preceding flip-flop.

The use of such multi-collector transistors having a base zone which is common to two or more separate collectors results in a considerable simplification of the integrated circuit, inter alia, because considerably less space at the semiconductor surface is necessary for a multi-collector transistor having, for example, three collectors than for three separate transistors. Furthermore, the number of required connections for a multi-collector transistor is considerably smaller than for an equivalent number of separate transistors as a result of which the wiring pattern is simpler with multi-collector transistors.

the flip-flop described is a particularly compact integrated circuit, inter alia as a result of the fact that the current injector used is very closely connected with the circuit elements to be biased. In addition to the circuit elements used, only one further zone, namely the injecting layer 20, and an extra rectifying junction, the p-n junction 18, is necessary for the current injector. The remaining layers of the current injector coincide with semiconductor layers necessary already for the circuit elements themselves. Furthermore, as shown in FIG. 1, the connections 15 and 16 to the injecting layer 20 and the intermediate layer 21 of the current injector may be provided at the edge of the body 12. The bias currents are supplied internally via the body by means of the current injector. As is shown diagrammatically in FIG. 2 with the connection 16', in the present example also the more readily accessible surface 39 which is situated on the oppositely located side of the body opposite to the surface 11 may be used for the connection of the intermediate layer.

An important contribution to the simplicity and the compactness of the integrated circuit originate from the fact that the current injector supplies not only the bias current for the base zones of the transistor but also the emitter-collector main currents required for said transistors. For example, the base zone 5 is connected inter alia to the collector zone 29 via a conductive track 14. The transistors $T_{29}$ and $T_{33}$ constitute a D.C.-coupled cascade. When transistor $T_{29}$ is conductive, the bias current supplied to the zone 5 by the current injector flows at least for a considerably part, via the said conductive track, as a main and supply current through the emitter-collector path of transistor $T_{29}$. In this manner, all the bias currents necessary for the flip-flop are obtained with a single connected source 17.

In this connection it is furthermore to be noted that also due to the fact that the bias currents are supplied as a current by the current injector, the usual load impedances in the emitter-collector circuits of the transistors are superfluous. Generally, this also provides a considerably space saving.

Another important aspect is that a large number of transistors the emitters of which are directly connected are incorporated in the circuit. These connected emitters may be constructed as a common emitter zone 21, the double-diffused three-layer structure which in itself is usual for transistors being used in the reverse direction. The smallest zone serves as a collector which is present at the surface and which, viewed on the surface 11, lies entirely on the base zone and which in the body is surrounded by the base zone. Said base zone is a surface zone which adjoins the surface 11 round about the collector and which extends from said surface in the intermediate layer 21 which also serves as an emitter. In itself, a transistor structure used in this manner has a lower current amplification factor $\beta$ than the conventional non-inverted transistor. However, for many circuits said lower current amplification factor $\beta$ is no objection and the use of a common emitter zone in combination with a current injector results in a very simple construction of the integrated circuit in which inter alia no space is necessary for separation zones for electric isolation of the transistors and the manufacture becomes considerably simpler. In addition, some measures to increase the current amplification factor $\beta$ of the inverted transistor structure will hereinafter be described.

It was already stated that the flip-flop described is entirely operated with a single connected source 17. This means inter alia that during operation all the voltages in the circuit lie within the range which is given by the potential difference supplied by the source 17 to the connections 15 and 16. This potential difference is in the forward direction across the p-n junction 18 between the injecting layer 20 and the intermediate layer 21. The charge carriers consequently injected in the intermediate layer and which in said layer are minority charge carriers can be collected by a region of the same conductivity type as the injecting layer 20, for example the zone 5, provided that the distance between the layer 20 and the zone 5 is not too large, in practice of the order of the diffusion length of the minority charge carriers in the intermediate layer. Such a current transfer from the injecting layer 20 to the zone 5 to be biased can take place when the junction 19 between the zone 5 and the intermediate layer 21 is biased in the reverse direction which may be effected, for example, by connecting the zone 5 via a conductive track 14 to a point of a suitable potential. In this case a second voltage source must be used in the circuit.

As is known, a rectifying junction need not necessarily be biased in the reverse direction to be able to collect charge carriers. The collected charge carriers may result in a potential variation of the zone 5 as a result of which a voltage in the forward direction is also set up across the junction 19. Injection of charge carriers across the junction 19 will certainly occur when said forward voltage becomes large enough, as a result of which a current flows across the junction in a direction opposite to that of the current flowing across said junction as a result of collection of charge carriers. The potential of zone 5 will adjust itself such that the difference of said two currents is equal to the base bias current necessary for operating the transistor 33, 5, 21, if desirable increased by the current which flows away via a connection at the zone 5. In this stationary condition, the potential of the zone 5 will generally lie between the potentials of the connections 15 and 16.

It will be obvious that in the case in which the junction 19 is operated in the reverse direction, the three-layer transistor 33, 5, 21 will be used with the zone 33 as the emitter, zone 5 as the base and layer 21 as the collector, the base bias current being supplied entirely or partly by the current injector. Also when a voltage in the forward direction is set up across the junction 19, the layer 21 may be used as the collector of the three-layer transistor 33, 5, 21, namely when the junction 40 between the zone 33 and 5 is biased far enough in the forward direction. More important, however, is that when the junction 19 is in the forward direction, the intermediate layer 21, as in the present example, can serve as the emitter of the transistor 21, 5, 33 which will be explained more fully below.

In the present example with the lateral current injector 20, 21, 5, the common body 12 is an n-type semiconductor body which constitutes the intermediate layer of the current injector, the intermediate layer 21 comprising a low-ohmic n-type substrate $21^a$ on which a high-ohmic n-type surface layer $21^b$ is provided. All the semiconductor zones of the circuit elements and the current injector adjoin the surface 11 of the surface layer $21^b$ remote from the substrate $21^a$. The injecting layer 20 and the base zones 1 to 10 are provided simultaneously and with the same doping concentration as p-type surface zones in the surface layer $21^b$ which is epitaxial in this case. As a result of this comparatively simple manufacturing technology, the doping concentrations and the gradients thereof in the proximity of the p-n junctions 18 and 19 are substantially equal. This equality of the two junctions 18 and 19 seems to exclude the use of the intermediate layer 21 as the emitter of the n-p-n transistor 21, 5, 33. Actually, the junction 18 constitutes the injecting junction of the current injector as a result of which the current in the forward direction at said junction must consist of holes as much as possible with a view to a reasonable efficiency, while for the same reason the current in the forward direction at the junction 19, as an emitter-base junction of the transistor, must consist of electrons as much as possible. In other words, because the epitaxial layer $21^b$ is an intermediate layer of the current injector, the doping concentration would have to be low, while for said expitaxial layer as an emitter of the transistor a high doping concentration is desirable.

In order to be able to use the intermediate layer 21 of the current injector as the emitter of the transistor all the same, the fact has been used that the ratio between the electron current and the hole current in an injecting junction depends not only upon the minority charge carrier concentration on either side of said junction given with the doping concentrations and the voltage across said junction, but is actually determined by the gradients of said minority charge carrier concentrations. These concentration gradients depend inter alia on the presence of a collecting junction such as the base-collector junction 40 and the distance from said junction 40 to the injecting junction 19. In the proximity of the collecting junction 40, the minority charge carrier concentration in the base zone 5 as a result of the collecting effect of said junction 40 is low dependent upon the biased voltage across said junction. When the distance between the junctions 40 and 19 is smaller than one or a few diffusion lengths of the minority charge carriers in the base zone 5, the collecting effect of the junction 40 results in an increase of the gradient of the minority charge carrier concentration. This effect may also be described as a shortening of the effective diffusion length of the minority charge carriers in the base zone 5. As a result of this it can be effected with the choice of the voltage across the junction 40 in comparison with that across the junction 19 and/or the distance between the junctions 19 and 40 in comparison with that between the junctions 18 and 19 that the forward current across the junction 18 consists for the greater part of holes, while the forward current across the junction 19 consists for the greater part of electrons in spite of the doping concentration of the layer 21 which is comparatively low for an emitter. The shortened effective diffusion length of the electrons in the base zone 5 must be smaller than that of the holes in the intermediate layer 21.

Figure 4:
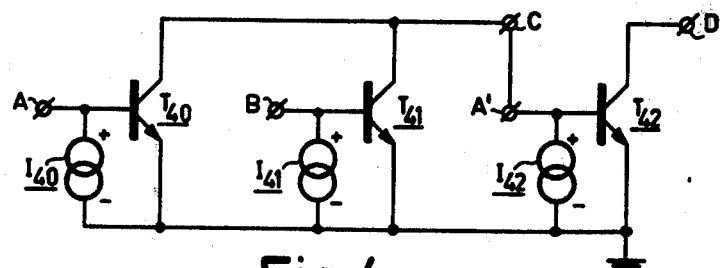
FIG. 4 shows a circuit diagram of a gate circuit according to the invention.

As already stated, the present flip-flop is constructed from a number of NOR gates which consist of a number of transistors the emitter-collector paths of which are connected in parallel. FIG. 4 shows such a NOR gate which consists of two or more gate transistors $T_{40}$, $T_{41}$ .... The gate transistors are succeeded by a transistor $T_{42}$. The inputs A, B ... of the gate transistors $T_{40}$, $T_{41}$ ... are constituted by the base electrodes of the transistors $T_{40}$, $T_{41}$, ..., hile their emitter-collector paths are shunted by the emitter-base path of the transistor $T_{42}$. The current injector is denoted diagrammatically with current sources $I_{40}$, $I_{41}$, and $I_{42}$ and the associated polarities between the bases and the emitters. The transistor $T_{42}$ will conduct current only (as a result of the current source $I_{42}$ which is operative in the forward direction) if neither the transistor $T_{40}$ nor the transistor $T_{41}$ is conducting, i.e., if both at the input A and at the input B earth potential prevails or at least a voltage is present relative to the emitter which is lower than the internal base input threshold voltage of the transistors $T_{40}$ and $T_{41}$ respectively. The currents of the source $I_{40}$ and $I_{41}$ flow to earth and since transistor $T_{45}$ is conductive, the voltage at its collector (point D) will have dropped substantially to earth potential. If at one or more of the inputs A and B the base input threshold voltage is exceeded indeed, the current of the source $I_{42}$ will flow via the input transistor(s) which is then conductive so that too little current remains for the base of the transistor $T_{42}$ to cause said transistor to convey current. The current injector thus forms the indicated current source $I_{42}$ and ensures the supply of the main current path of the transistors $T_{40}$, $T_{41}$ ..., while the base-emitter junction of the transistor $T_{42}$ constitutes the load impedance of said transistors.

In many circuits more than two gate transistors $T_1$ and $T_2$ will be connected between the point C and earth with their collector-emitter paths (fan-in), while several transistors will also be connected between said points with their base-emitter path, like transistor $T_{42}$. The points A and B, respectively, are then connected, for example, to the outputs C' of preceding similar gate circuits, while the output C of the gate circuit shown will lead to several inputs A' or B' of subsequent similar gate circuits. The fan-out is limited by the collector-base current amplification factor $\beta$ of the transistors used.

From the above it will be obvious that in addition to transistors which are conductive and the emitter-base voltage of which lies above the threshold voltage, non-conductive transistors occur in such circuits the emitter-base path of which is substantially short-circuited. This means that in an integrated circuit as shown in FIG. 1 parasitic transistor action between various base zones, for example the base zones 4 and 5, can easily occur when the distance between said zones is not too large. In connection herewith a surface zone $21^c$ belonging to the intermediate layer 21, so also n-type, which is more highly doped than the base zones 4 and 5 extends between said two base zones 4 and 5 to be biased. For reasons of space saving, said more highly doped surface zone 21$^c$ directly adjoins the base zones which are to be separated electrically. However, also when said n+ zone 21$^c$ is present at some distance from the base zones to be separated, the stray transistor action, if any, is effectively suppressed.

Figure 5:
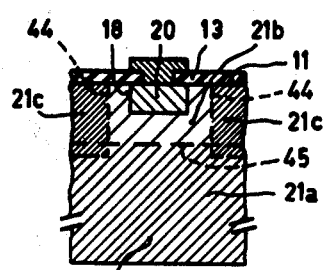
FIG. 5 is a diagrammatic cross-sectional view of the embodiment shown in FIG. 1 and 2 taken on the line V—V of FIG. 1.

In the present example, the surface zone 21$^c$ is present not only between the base zone to be separated but each of the base zones 1 to 10 is substantially entirely surrounded at the surface 11 by a combination consisting of a part of the injecting layer 20 and the more highly doped zone 21$^c$. Each of the base zones is surrounded on three sides by a U-shaped part of the zone 21$^c$. In the cross-sectional view shown in FIG. 5 it may be seen that a small aperture is still present on either side of the injecting layer 20 between the junction 18 and the n+-n junction 44 which is not shown in FIG. 1 for clarity and which is formed between the low-ohmic U-shaped parts of the zone 21$^c$ and the adjoining high-ohmic part 21$^b$ of the intermediate layer.

With this surrounding it is achieved that each of the base zones 1 to 10 extends in, at least adjoins, a comparatively small n-type region which, in as far as it adjoins n-type material, is substantially entirely enclosed within the n+-n junction 44 and the n+-n junction 45 between the substrate 21$^a$ and the epitaxial layer 21$^b$. These n+-n junctions constitute a barrier for the holes present in the epitaxial layer 21$^b$ as a result of which the holes injected in such an enclosed part by the injecting layer 20 or the base zone 5 flow away less easily to parts of the n-type intermediate layer 21 which are farther remote from the junctions 18 and 19. This increase of effective diffusion length of holes in the part of the epitaxial layer 21$^b$ adjoining the base zone 5, as well as the above-mentioned shortening of the effective diffusion length of the electrons in the base zone, so on the other side of the junction 19, results in an increase of the current amplification factor $\beta$ of the three-layer transistor 21, 5, 33. In connection with the above, the n-type region 21$^b$ adjoining the base zone 5 is preferably enclosed as much as possible. Furthermore, said region 21$^b$ preferably is as small as possible so as to restrict the loss of minority charge carriers by recombination. The base zones and the injecting layer 20 preferably extend up to the n+ substrate 21$^a$, at least up to an n+ layer. This has the additional advantage that the injection of the injecting layer 20 will take place mainly in the lateral direction along the surface 11. When the thickness of said zones is smaller than that of the surface layer 21$^b$, as shown in FIG. 2 the n+ surface zone 21$^c$ preferably extends up to or in the substrate 21$^1$. Although small apertures in the enclosure have a comparatively small adverse effect, the n+ surface zone at the surface 11 preferably adjoins the injecting layer 20 directly. The presence of the aperture shown in FIG. 5 on either side of the injecting layer is rather related to the manner of manufacturing the integrated circuit than to the effect in view of the enclosure.

Dependent upon the method of manufacturing, losses by surface recombination may play a more or less important part. When the properties of the semiconductor surface 11 and the junction between said surface and the insulating layer 13 are of such a nature that the surface recombination is relatively high, the current amplification factor of the transistor, when the zone to be biased is, for example, uniformly doped, for example, forms part of an epitaxial layer, may be increased by providing at least in the part of the base zone to be biased and adjoining the semiconductor surface, a gradient in the doping concentration, the concentration decreasing from the surface in a direction transverse to the semiconductor surface. The resulting drift field then keeps the minority charge carriers away from the surface. When the surface zone 21$^c$ does not directly adjoin the base zone but when the region 21$^b$ therebetween reaches up to the surface, a corresponding concentration gradient in the layer of the region 21$^b$ adjoining the semiconductor surface is desirable for the same reason. Such a gradient in the region 21$^b$ can be simply obtained, for example, simultaneously with the provision of the usually diffused collector zone 33.

The injecting layer 20 has the form of a ribbon-shaped surface zone along which on either side several base zones 1 to 10 to be biased and separated therefrom are juxtaposed. In this manner a large number of zones to be biased can be provided with bias current with the same injecting layer. The series resistance of such an elongate injecting layer 20 can be reduced by means of a continuous or interrupted conductive track 46.

Figure 6:
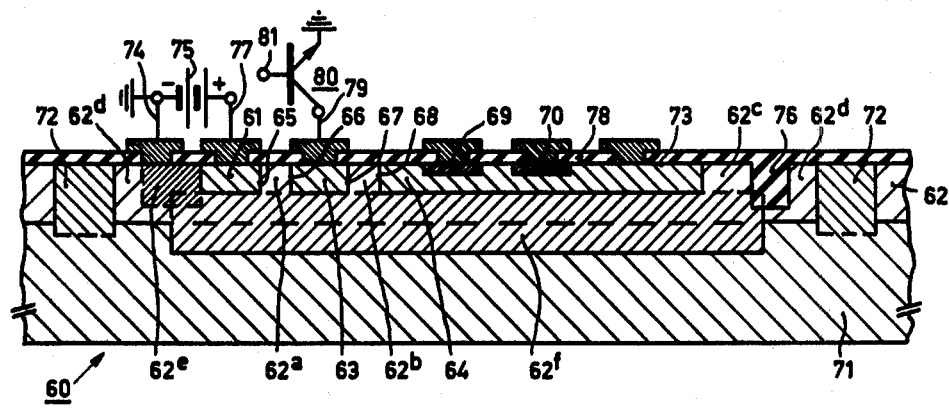
FIG. 6 is a diagrammatic cross-sectional view of a part of a second embodiment of the integrated circuit according to the invention.

FIG. 6 is a cross-sectional view of a second embodiment of the integrated circuit according to the invention. The common body 60 comprises a current injector having five successive layers 61, 62$^a$, 63, 62$^b$, 64 which are separated from each other by rectifying junctions 65, 66, 67 and 68. As already described with reference to the preceding example, by injection of charge carriers from the injecting layer 61 the third layer 63 of the current injector can assume a potential at which the junction 66 and also the junction 67 come in the forward direction. This means that the second or intermediate layer 62$^a$ can inject charge carriers into the third layer 63, which carriers can be collected by the fourth layer 62$^b$, as well as that the third layer 63 in its turn can inject charge carriers into the fourth layer 62$^b$, which carriers can be collected therefrom, if a fifth layer 64 is present, by said fifth layer through the junction 68 adjoining and bounding said fifth layer 64. In the present example the fifth layer 64 of the current injector also constitutes the base zone to be biased of a bipolar transistor which may be constituted, for example, by the layers 69, 64 and 70.

The said layers of the current injector and of the transistor may be provided, for example, in a thin semiconductor layer which is present on an insulating substrate, the five layers of the current injector extending, for example, throughout the thickness of said semiconductor layer. In the example shown, the intermediate layer 62$^a$ and the fourth layer 62$^b$ constitute in the body a continuous region of the same conductivity type. The remaining parts of said region are denoted in FIG. 6 by 62$^c$ to 62$^f$. This region belongs at least for the greater part to an epitaxial layer 62 of one conductivity type which is provided on a semiconductor substrate 71 of the opposite conductivity type, the said region, hereinafter termed island, being separated, by means of separation zones 72 of the opposite conductivity type, from the remaining parts of the epitaxial layer 62. The island comprises a buried layer 62$^f$ of one conductivity type having a doping concentration which is higher than the original concentration of the epitaxial layer 62. This buried layer is present at and in the immediate proximity of the interface of the substrate and the epitaxial layer. The layers 61, 63 and 64 of the current injector are surface zones which reach from the surface 73 to the buried layer 62. As a result of this the diffusion voltage at said parts of the p-n junctions between the injecting layer 62 and the third layer 63 on the one hand and the island on the other hand which are substantially parallel to the surface 73 is larger than that of the parts 65, 66 and 67 of said junctions. In consequence of this, the injection of the charge carriers by the layers 61 and 63 will preferably take place in a lateral direction substantially parallel to the surface 73. In addition, the layers 62$^a$ and 62$^b$ in which said injection takes place are very small so that, as already described, comparatively few injected charge carriers are lost in the island.

In this example also, the combination of current injector and circuit element is surrounded as much as possible so as to restrict the flowing away of minority charge carriers in a lateral direction. A low-ohmic zone 62$^e$ which belongs to the island adjoins the injecting layer. The zone 62$^e$ serves to restrict the injection of charge carriers of the injecting layer in a lateral direction on the side of the injecting layer remote from the zone to be biased by increasing the diffusion voltage. The zone 62$^e$ also serves as a contact zone for the connection 74 for one polarity of an external source 75 to the intermediate layer 62$^a$ of the current injector.

The desirable enclosure of the base zone 64 to be biased has been obtained in this example by means of an insulating layer 76 which at least partly is sunken in the body 60 and which extends, from the surface 73, in the semiconductor layer 62 in which the zones to be biased are present. In this example the insulating layer 76 extends only over a part of the thickness of the layer 62. This sunken insulating layer 76 surrounds the base zone 64 for the greater part and adjoins as much as possible the third layer 63, the injecting layer 61 or the zone 62$^e$, according as bias current is supplied simultaneously with the third layer 63 and/or injecting layer 61 to several juxtaposed zones to be biased, or to the base zone 64 alone.

The injecting layer 61 is provided with a connection 77 shown diagrammatically for the other polarity of the source 75. The current injector shown is furthermore provided with means for controlling or adjusting the bias current to be received by the base zone 64 to be biased. Such a control can be obtained, for example, by means of an insulated electrode to be provided on the insulating layer 78 above the intermediate layer 62$^a$ and/or the fourth layer 62$^b$, the potential of said electrode influencing the recombination of the minority charge carriers at the surface of said layers. In the present example another possibility of controlling the bias current is used, namely control by withdrawing current from the third layer 63 of the current injector. For that purpose said third layer 63 is provided with a conductive connection 79. When the third layer is short-circuited, for example, via said connection to the fourth layer 62$^b$ or the intermediate layer 62$^a$, the voltage across the junctions 66 and 67 will be so small that the third layer 63 collects but that no or substantially no injection from the third layer occurs so that no bias current is supplied to the base zone 64. Such a situation in which no bias current is supplied by the current injector to one or more circuit elements of the circuit may be permanently desirable, in which case the junction 66 and/or the junction 67 can simply be short-circuited at the surface 73 with a conductive layer. The bias current for the base zone 64, however, may also be switched on or off temporarily when, for example, an electronic switch is provided between the connections 79 and 74. Such a switch is shown diagrammatically in FIG. 6 by the transistor 80 the base 81 of which, for example, can be controlled by a further part of the circuit and which can simply be integrated in the body 60. Of course, also only a part of the current flowing through the current injector and available as bias current can be withdrawn via the transistor 80.

The above mentioned island which comprises the layers of the current injector can form an emitter zone which is common to a number of transistors. The transistor shown in that case is a multicollector transistor having two collectors 69 and 70. The injecting layer 61, for example, is ribbon-shaped, several base zones which are not visible in the cross-sectional view being arranged beside each other along said ribbon-shaped surface zone. One or more of said base zones can form, for example, a three-layer current injector with the injecting layer 61 and the intermediate layer formed by the island, which layers are common. One or more other base zones, among which the zone 64, form part of a five-layer current injector in that the layer 63 extends between the common injecting layer 61 and the relevant base zones. The layer 63 may be common to said base zones to be biased but may also consist of separate parts which are separated from each other so that the bias current can be controlled for each individual base zone.

In addition to the island shown in which the current injector and one or more transistors are provided, the integrated circuit may comprise other islands which are insulated from each other and in which circuit elements are provided in a corresponding manner. Circuit elements may also be present in one or more islands and be provided with bias current in a usual manner and without the use of a current injector.

Figure 7:
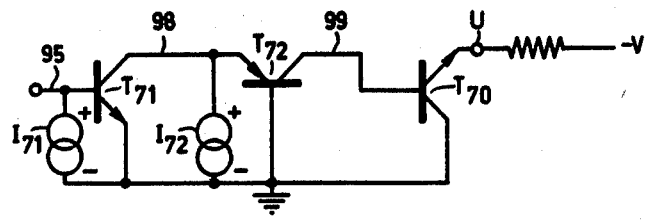
FIG. 7 is a circuit diagram of a part of a third embodiment of the integrated circuit according to the invention, of which part

An important advantage of the gate circuit according to the invention described is that it can be operated with very low currents and voltages, so with low dissipation. The low value of said logic signal voltages and/or signal currents means, however, that in the case of combination in a larger assembly together with different logic circuits, for example TTL or MOST circuits, an adaptation of the signal value must take place. Such an adaptation can be obtained in a particularly simple manner with an invertor or a transistor connected as an emitter follower. For example, the transistor $T_{37}$ in FIG. 3 may be an extra invertor the collector of which is connected, for example, via a resistor, to a point of comparatively high positive potential. The voltage variations at the output Q may then be considerably larger than those at the output proper of the flip-flop, the collector of the transistor $T_{34}$. The transistor $T_{37}$ constituted by the layers 21, 10 and 37 may also be used with the surface zone 37 as emitter and the layer 21 as collector. In that case, said transistor forms an emitter follower. The emitter zone 37 may lead, for example, via a resistor, to a point of comparatively high negative potential. Such an emitter follower to be used at the output of the circuit is shown in FIG. 7 as the transistor $T_{70}$ connected to the output terminal U. The transistor $T_{71}$ is, for example, one of the transistors of a gate circuit or an added invertor dependent upon the desirable output signal. In this example the logic signal of low value is not directly supplied to the base of the output transistor $T_{70}$ but via the emitter-collector path of a complementary transistor $T_{72}$, as a result of which a higher voltage is admissible and the danger of breakdown is smaller. Another possibility is that the output signal is derived from the collector 99 of transistor $T_{72}$, in which case the transistor $T_{70}$ may be omitted.

Figure 8:
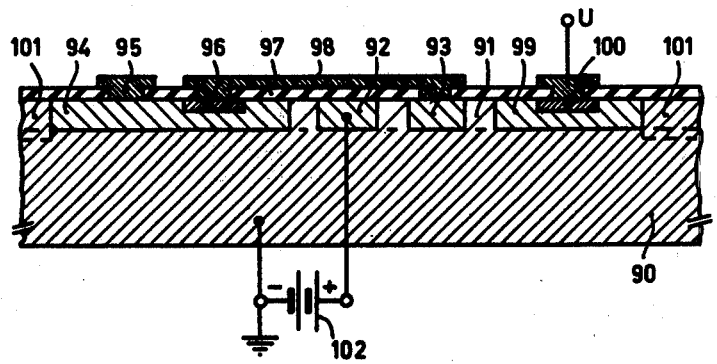
FIG. 8 is a diagrammatic cross-sectional view.

FIG. 8 shows how the circuit shown in FIG. 7 can be incorporated in the integrated circuit according to the invention. The common body has a low-ohmic n-type semiconductor substrate 90 with a high-ohmic n-type surface layer 91 in which a number of p-type surface zones are provided which extend up to the boundary between the substrate 90 and the surface layer 91. The body comprises a current injector having a p-type injecting layer 92, an n-type intermediate layer formed by the substrate 90 and the surface layer 91 and two p-type zones to be biased, namely the emitter zone 93 of transistor $T_{72}$ and the base zone 94 of the transistor $T_{71}$. The current injector is denoted in FIG. 7 by the two current sources $I_{71}$ and $I_{72}$.

The n-type body simultaneously forms the emitter of transistor $T_{71}$, the base of transistor $T_{72}$ and the collector of transistor $T_{70}$. The transistor $T_{71}$ furthermore comprises a connection 95 on the base zone 94 and an n-type collector zone 96 which is connected to the emitter of transistor $T_{72}$ via a conductive track 98 present on the insulating layer 97. The collector of transistor $T_{72}$ is constituted by the p-type zone 99 which is also the base zone of the transistor $T_{70}$. Transistor $T_{70}$ furthermore comprises an n-type emitter zone 100 connected to the output terminal U. Highly doped n-type zones 101 adjoin the p-type zones 94 and 99 so as to restrict the above mentioned loss of charge.

The injecting layer 92 and the intermediate layer 90, 91 of the current injector are connected to a source 102. The current injector supplies on the one hand the base bias current for the transistor $T_{71}$ and on the other hand the main or supply current for the emitter-collector path of the transistor $T_{72}$ via the body, or that for the emitter-collector path of the transistor $T_{71}$ via the track 98. When transistor $T_{71}$ is conductive, the transistors $T_{72}$ and $T_{70}$ are non-conductive, the latter because no base current is available due to the fact that the transistor $T_{72}$ is non-conductive. The voltage at the terminal U is then substantially equal to $-V$. When transistor $T_{71}$ is non-conductive, the current of current source $I_{72}$ flows via the transistor $T_{72}$ as a base current to transistor $T_{70}$. Transistor $T_{70}$ is conductive and the voltage at the terminal U is substantially zero or at least small as compared with the voltage $-V$.

Figure 9:
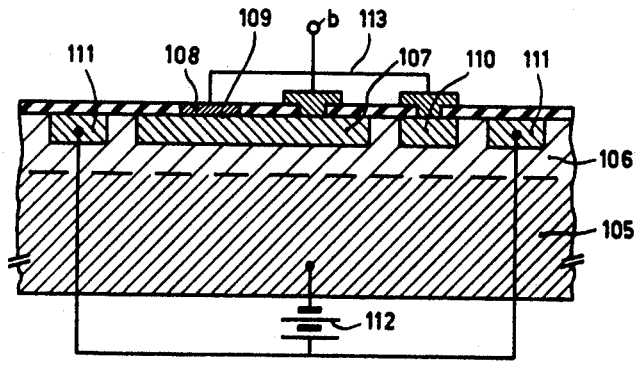

FIG. 9 shows another example of an integrated circuit having complementary transistors. The semiconductor body has a substrate 105 and an epitaxial layer 106. In the epitaxial layer a surface zone 107 of the opposite conductivity type is present which at the same time constitutes the base zone of a vertical transistor and the emitter of a lateral complementary transistor. The vertical transistor has an emitter 105, 106, a base 107 and a collector 108, which latter is in this case constituted by a metal-containing layer, for example an aluminum layer, which is provided on the base zone and which forms a Schottky junction with said base zone. In connection with the formation of said Schottky junction, the surface concentration of the doping in the base zone in this case is smaller than $10^{17}$ to $10^{18}$ atoms/ccm. The Schottky junction 109 is the collector-base junction of the transistor. The lateral transistor comprises an emitter zone 107, a base zone 105, 106 and a collector zone 110. The zones 107 and 110 are zones to be biased which together with the intermediate layer formed by the body 105, 106 and the injecting layer 111 form a three-layer current injector. Both last mentioned layers are connected to a source 112 for supplying bias current. A connection 113, shown diagrammatically, is present between the collectors 108 and 110, while the zone 107 is provided with a connection $b$.

Figure 10:
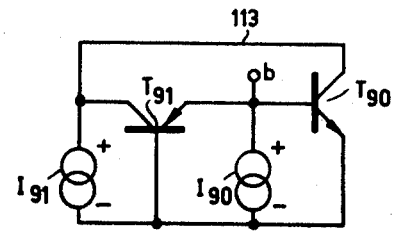
FIG. 10 shows a circuit diagram associated with said fourth embodiment.

The electric equivalent circuit diagram of said integrated circuit is shown in FIG. 10 in which the vertical transistor 106, 107, 108 is denoted by $T_{90}$ and the lateral transistor 107, 107, 110 by $T_{91}$. In this case also the current injector is denoted by two current sources $I_{90}$ and $I_{91}$.

The current supplied to the base of $T_{90}$ by the current injector will cause said transistor to become conductive. As a result of this the current supplied to the collector zone of the transistor $T_{91}$ via the body by the current injector will mainly flow from thence via the connection 113 through the collector-emitter path of transistor $T_{90}$. As a result of this the voltage at the collector of transistor $T_{91}$ falls below the voltage at the electrode $b$ of the transistor $T_{90}$ as a result of which current starts flowing across the lateral transistor $T_{91}$ which is withdrawn from the bias current supplied to the base zone 107 by the current injector. Ultimately, a situation will be reached in which only a small fraction of the bias current supplied to the zone 107 flows as a base current through the transistor $T_{90}$ namely such a small amount that said transistor operates in its linear operating range. With such a biasing, no more storage takes place than is just necessary to operate the transistor in its strongly conductive condition.

Figure 11:
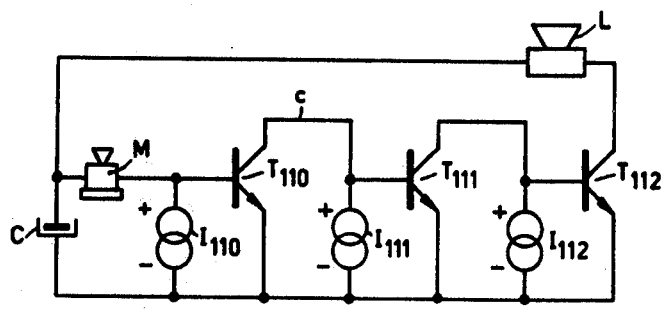
FIG. 11 is a circuit diagram of a fifth embodiment of the integrated circuit according to the invention.

Other linear circuits are also simple to realize. For example, a linear amplifier of which the equivalent circuit diagram is shown in FIG. 11. This comprises three transistors $T_{110}$, $T_{111}$ and $T_{112}$. The collector $c$ of the first transistor is connected to the base $b$ of the second, the collector of the second transistor to the base of the third transistor, while finally the collector of the third transistor is connected to the base of the first transistor via a circuit which permits direct current flow and which comprises a loudspeaker or telephone L and a microphone M. The capacitor C serves to suppress alternating current negative feedback coupling. As a result of the direct current negative feedback coupling via the said direct current-transmitting circuit, only so much base current will again be available for each of the transistors as described with reference to FIGS. 9 and 10 (the rest of the current of the sources $I_{110}$, $I_{111}$ and $I_{112}$ flowing via the collector-emitter circuit of the preceding transistor in the cascade) that said transistors are adjusted in their linear operating range. In this manner an extremely simple amplifier is obtained, for example, for hearing aids.

In the integrated circuit, the base zones of the transistors $T_{110}$, $T_{111}$ and $T_{112}$ can be provided beside each other along a ribbon-shaped injecting layer in a manner similar to that described with reference to FIG. 1. Another possibility is to use a current injector in a vertical construction instead of a lateral current injector.

Figure 12:
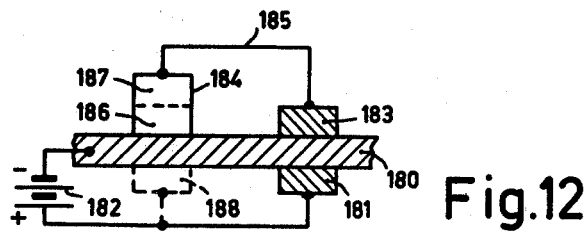
FIG. 12 shows diagrammatically the principle of an embodiment according to the fourth aspect of the invention.

The principle of such a construction is shown in FIG. 12. The integrated circuit has a semiconductor layer 180, for example an n-type layer, which may form, for example, part of a substrate of the circuit. An injecting contact in the form of the p-type layer 181 is present on one side of said layer. Between the layer 180 and the injecting contact 181 a source 182 is connected with which the rectifying junction between the layer and the contact is biased in the forward direction. The charge carriers, in this case holes, injected as a result in the layer 180 can reach the p-type layer 183 present on the other side of the layer 180 opposite to the injecting contact, provided the layer 180 is not too thick, for example not thicker than a diffusion length. As a result of this the layer 183 assumes a positive potential relative to the n-type layer 180. In this manner an energy source is obtained on the oppositely located side of the layer 180 which can supply current and which can be connected to one or more circuit elements, for example the circuit element 184. This connection can be obtained via a conductor 185 or also via an internal connection present in the semiconductor body.

If further a connection is provided between the circuit element 184 and the layer 180, the current of the current injector may flow through the circuit element, for example as a supply current. Such a connection can be obtained again via a conductor or, for example, also in that the layer 180 itself forms part of the circuit element 184. The circuit element is, for example, a transistor the emitter of which is formed by the layer 180. The transistor furthermore has the diagrammatically shown base zone 186 and collector zone 187. The layer 180 may also be an emitter zone which is common to a number of transistors in grounded emitter arrangement.

By providing, opposite to the base zone 186, a second injecting contact 188 shown in the Figure in broken lines, a second current injector 188, 180, 186 is obtained which can supply the required base bias current. In this manner, all the bias current for the transistor is supplied by means of the same external source 182 via current injectors, substantially no wiring being necessary for said current supply on the side of the layer where the circuit elements are present. Moreover, the layer 180 may be grounded, the bias current being supplied transversely through the grounded layer 180 to the circuit element.

Also with reference to a few of the following examples, the principle shown in FIG. 12 will be described and explained in detail.

Figure 13:
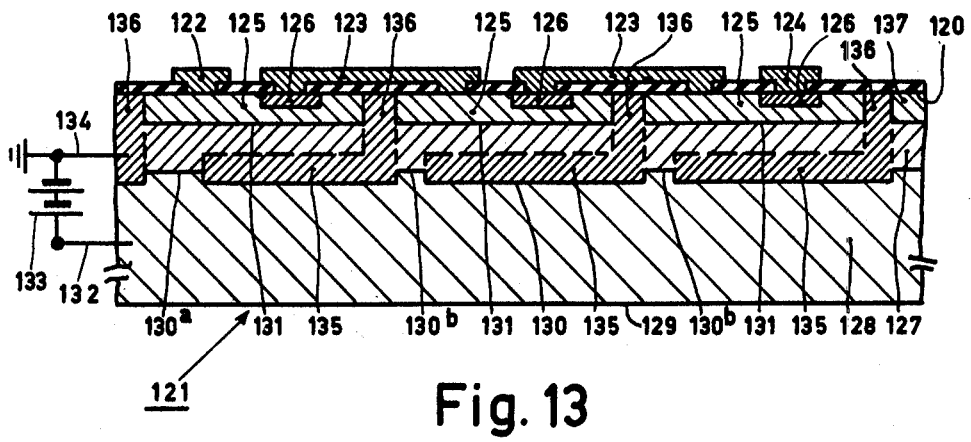

As already stated, a vertical current injector may be used upon integration of the circuit shown in FIG. 11. The integrated circuit in that case may have the form as is shown in FIG. 13.

In this case also, the transistors are arranged beside each other on one side 120 of a common body 121. Semiconductor zones of said transistors are connected to a pattern of conductive tracks 122, 123 and 124. This pattern has an input for electric signals, namely the track 122 along which the input signals originating from the microphone M are supplied to the base 125 of the first transistor. The pattern furthermore has an output, namely the track 124 along which the amplified output signals of the third transistor are supplied into the loudspeaker L. The tracks 123 connect a collector zone 126 to the base zone 125 of the subsequent transistor.

The transistors furthermore have a common emitter zone formed by an epitaxial layer 127 of one conductivity type which is provided on a substrate 128 of the opposite conductivity type.

The body 121 has a current injector of which the injecting layer which is formed by the substrate 128 adjoins the side 129 of the body situated opposite to the side 120 and of which a layer 125 separated from the injecting layer 128 and the source connection 132 of the source 133 connected thereto by two rectifying junctions 130 and 131 extends opposite to the injecting layer 128 on the side 120, said oppositely located layer 125 collecting charge carriers from an adjacent layer 127 of the current injector via a junction 131 bounding said layer and thus receiving current which serves as a bias current for the base of the transistor and possibly for the collector of the preceding transistor connected thereto. The epitaxial layer 127 which at the same time forms the the common emitter zone of the transistors and the intermediate layer of the current injector comprises a source connection 134 for the other polarity of the source 133.

In this example the intermediate layer 127 of the current injector is constructed as a reference potential plane for the amplifier circuit. This plane to which may be applied a reference potential, for example earth, separates all the zones 125 of the transistors present on the side 120 and to be provided with bias current by means of the current injector from the injecting layer 128 present on the oppositely located side 129. In this manner an electric screening is obtained in which the required bias current is supplied, transversely through the usually grounded layer 127, directly to the relevant zone to be biased.

The intermediate layer 127 has more highly doped sub-zones of the same conductivity type constituted by a buried layer 135 and an upright wall 136 which extends from the surface 120 down to the buried layer 135. This upright wall 136 may also fully or partly be constituted by a sunken insulating layer.

These sub-zones and notably the parts 136 serve to suppress parasitic transistor action between the juxtaposed base zones 125. Moreover, said parts 136 may in this case be used to bound the separate base zones 125 which are each constituted by parts of an epitaxial layer 137 of the opposite conductivity type separated from each other by parts 136 which are provided on the epitaxial layer 127 of the one conductivity type. Furthermore, the parts 136 together with the buried layers 135 constitute an enclosure of the zones 125 to be biased so as to confine as much as possible the minority charge carriers injected from said zones 125 into the intermediate layer 127 in the high-ohmic regions of the intermediate layer 127 and thus to obtain the desirable increase of the effective diffusion length of said charge carriers. In this manner, the sub-zones 135, 136 separate the transistors from each other and from the substrate 128. Although not necessary, small apertures are preferably present in said separating sub-zones, in the example at the area of the parts 130$^a$ and 130$^b$ of the junction 130. These parts 130$^a$ and 130$^b$ of the junction 130 then have a lower diffusion voltage than the remaining part of the junction 130 so that the injection of charge carriers from the injecting layer 128 into the intermediate layer 127 takes place mainly via said parts 130$^a$ and 130$^b$, the injection in the reverse direction from the intermediate layer 127 into the injecting layer 128 being comparatively small due to the comparatively low doping of the intermediate layer at that area.

The ratio between the bias currents supplied to the various base zones 125 can be influenced with the size of the area of the parts 130$^a$ and 130$^b$ of the junction 130. In this example the surface area of the part 130$^a$ is larger than that of the parts 130$^b$, as a result of which the current source $I_{110}$ in FIG. 11 which ensures the supply current for the output transistor $T_{112}$ supplies more current than the sources $I_{111}$ and $I_{112}$.

A simple method for (if desirable automatic) gain control can be obtained by using, for example, two collectors as in the transistor shown in FIG. 6. If one of these collectors is connected to ground via a controllable resistor (for example the internal resistor of a transistor) the signal current to the other collector will become dependent on said resistor so that it can easily be controlled, if desirable automatically.

Figure 14:
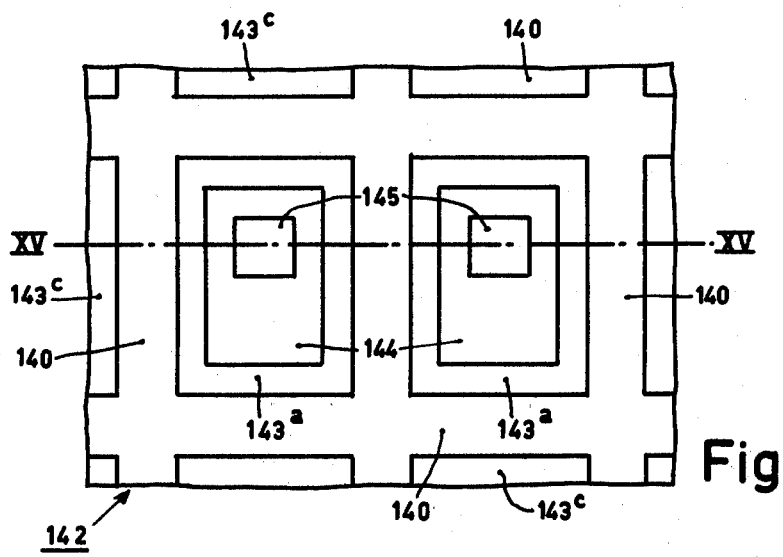
FIG. 14 is a diagrammatic plan view of a part of a sixth embodiment of the integrated circuit according to the invention.
Figure 15:
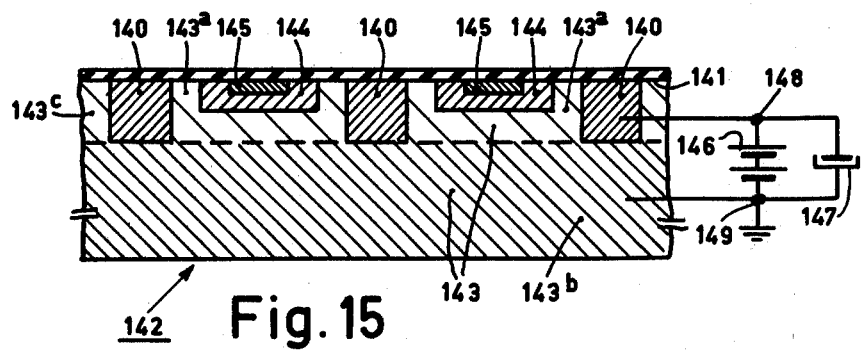
FIG. 15 is a diagrammatic cross-sectional view of said sixth embodiment taken on the line XV-XV of FIG. 14.

In the embodiment shown in FIGS. 14 and 15 the injecting layer has the form of a grid-shaped surface zone 140 which adjoins the side 141 of the body 142. In the parts 143$^a$ of the region 143 of the opposite conductivity type surrounded at the surface 141 by the grid-shaped surface zone 140 of one conductivity type, the zones 144 to be biased are present which constitute the base zones of three-layer transistors 143, 144, 145.

The region 143 which constitutes the intermediate layer of the current injector has a low-ohmic substrate and a high-ohmic surface layer which is subdivided into parts 143$^a$ and 143$^c$. This subdivision is obtained with the grid-shaped injecting layer 140 which extends from the surface 141 up to or in the substrate 143$^b$. As is shown, transistors or also other circuit elements may be provided in the high-ohmic parts 143$^a$ and 143$^c$. Furthermore, said parts may be different in size and several circuit elements can be provided beside each other in one or more parts.

One of the advantages of the use of a grid-shaped surface zone 140 as an injecting layer of the current injector is that the series resistance in such a zone may be low. For the same reason a large depth of penetration and/or a higher doping concentration may be used for the injecting layer than for the base zones 144. The maximum admissible doping concentration of the base zones 144 is restricted as a matter of fact, inter alia since in said zones, zones 145 of the opposite conductivity type have usually to be provided.

A direct current source 146 may be connected between the injecting layer 140 and the intermediate layer 143 of the current injector. Both for this and the other examples it holds that such a source can be shunted, if desirable, with a capacity 147 to short-circuit the connections 148 and 149 for alternating voltage.

Figure 16:
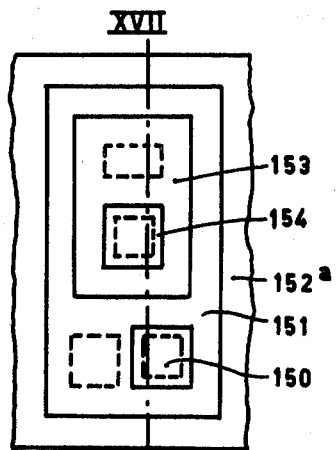
Figure 17:
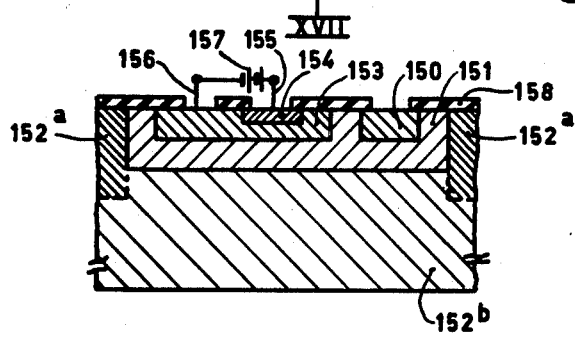
FIG. 17 is a diagrammatic cross-sectional view taken on the line XVII—XVII of FIG. 16.

A further embodiment of the integrated circuit comprises one or more three-layer transistors 150, 151, 152$^{a,b}$ as shown in FIGS. 16 and 17. In addition to the n-type emitter or collector zone 150, an n-type zone 153 extends in the base zone 151 which is, for example, p-type, said n-type zone 153 in turn surrounding a further p-type surface zone 154. Said zones 153 and 154 constitute the intermediate layer and the injecting layer, respectively, of the current injector. Shown in broken lines in FIG. 16 are furthermore apertures in the insulating layer 158 present on the semiconductor surface via which the zones 150, 151, 153 and 154 are connected to conductive tracks for electric connection. The injecting layer 154 and the intermediate layer 153 of the current injector are provided with the connections 155 and 156, respectively, shown diagrammtically in FIG. 17, for connection of a source 157. The present embodiment is particularly suitable if only one or a few of the circuit elements of a circuit need be provided with bias current by means of a current injector. The intermediate layer 153 may also be connected directly to the region 152$^{a,b}$ of the transistor, for example in that the intermediate layer 153 at the semiconductor surface extends to or in the low-ohmic zone 152$^a$. As a result of this, space is saved while in addition the connection 156 may be provided, if desirable, on the lower side on the substrate 152$^b$.

Figure 18:
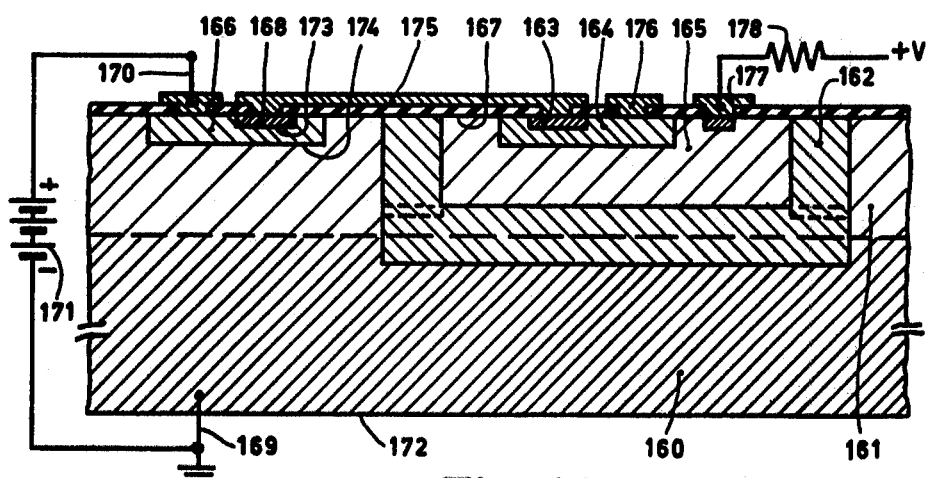
FIG. 18 is a diagrammatic cross-sectional view of an eighth embodiment of the integrated circuit according to the invention.

In a following embodiment the circuit elements are provided on a surface 167 of a common body which is constituted by a low-ohmic n-type substrate 160 on which a lower-doped n-type epitaxial layer 161 is provided (FIG. 18). In the epitaxial layer a number of circuit elements which are isolated from each other are provided in a manner known in semiconductor technology by means of p-type regions 162; for simplicity only one of the elements is shown in the drawing, namely the n-p-n transistor 163, 164, 165.

The n-type body 160, 161 which constitutes a ground plane for the integrated circuit, also is the injecting layer of a current injector which furthermore comprises the p-type intermediate layer 166 and the n-type third layer 168 adjoining the surface 167.

The injecting layer 160, 161 and the intermediate layer 166 are provided with connections 169 and 170, respectively, for connection of the source 171. Furthermore, the injecting layer 160, 161 adjoins the side 172 of the body located opposite to the side 167, and the third layer 168 of the current injector which is separated from the injecting layer by two p-n junctions 173 and 174 is situated on the side 167 and opposite to the substrate 160. The oppositely located third layer 168 of the current injector collects, via the junction 173, charge carriers from the adjacent intermediate layer 166 of the current injector and thus receives current which serves as a bias current for the emitter 163 of the transistor 163, 164, 165 which is connected, via a conductive track 175, to the oppositely located layer 168 of the current injector. It will be obvious that via the conductive track 175 several zones to be biased of circuit elements can also be connected simply to the same oppositely located layer 168 of the current injector.

Via a connection 176, electric signals can be supplied to or taken from the base 164 of the transistor, while the collector 165 may be connected to a point of positive voltage +V via a connection 177, for example, via an impedance 178.

The last-described embodiment is particularly suitable for applications in which bias current has to be supplied to one or a few circuit elements which are situated, for example, in the center of a large integrated circuit. The required bias current can locally be brought from the ground plane of the circuit to the surface by means of a current injector which occupies little extra area, and be conducted, via the pattern of conductive tracks, to the adjacent zones to be biased of the circuit elements in question. For this supply of bias current no resistors are necessary while nevertheless no fixed potential is impressed upon the zones to be biased so that said zones can convey, for example, electric signal current or signal voltage.

Figure 19:
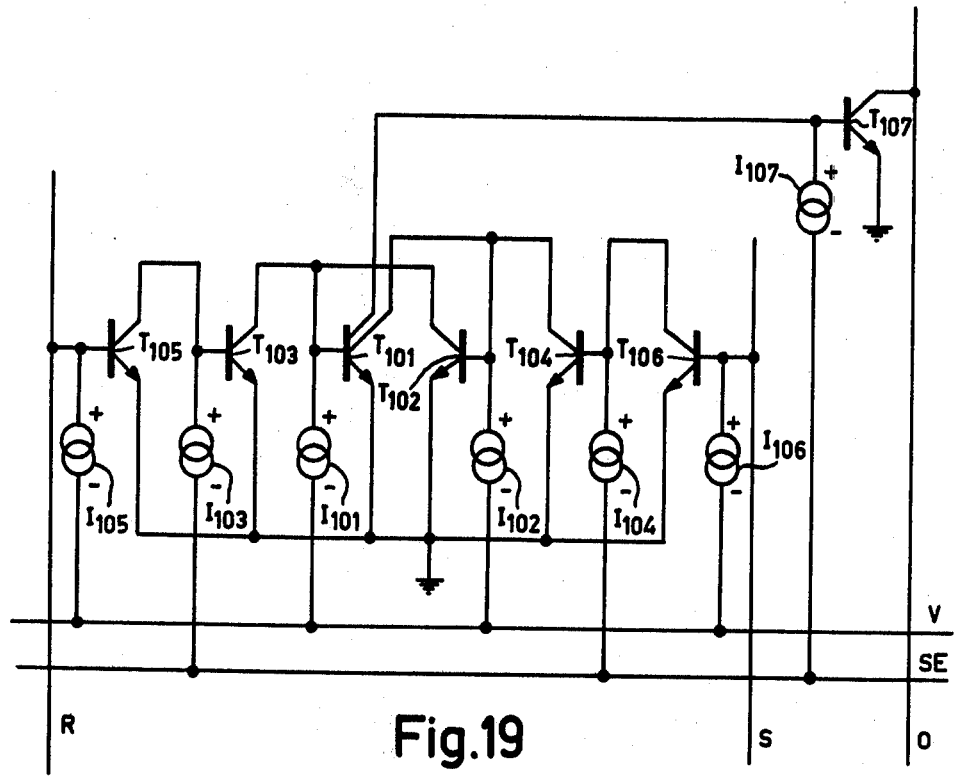

FIG. 19 shows the circuit diagram of a trigger circuit of a group of trigger circuits constructed in a corresponding manner which, according to a matrix pattern, together constitute a memory circuit according to the invention.

The trigger circuit comprises the transistors $T_{101}$ ... $T_{107}$ whose emitters are all connected to ground potential. The trigger circuit proper is constituted by the transisitors $T_{101}$ and $T_{102}$ whose collectors are connected crosswise to the base of the other transistor. Furthermore the base of transistor $T_{101}$ is connected to the collector of transistor $T_{103}$ whose base in turn is connected to the collector of transistor $T_{105}$. In the same manner the base of transistor $T_{102}$ is connected to the collector of transistor $T_{104}$ whose base is connected to the collector of transistor $T_{106}$. Furthermore the base electrodes of the transistors $T_{105}$ and $T_{106}$ are connected to the write conductors R and S which are common to a column of trigger circuits. In order to enable reading out, the transistor $T_{101}$ comprises an extra collector which is connected to the base of the transistor $T_{107}$ whose collector is connected to the read conductor O which is common to a column of trigger circuits.

Let it be assumed that the base electrodes of the transistors $T_{101}$, $T_{102}$, $T_{105}$ and $T_{106}$ are connected, via current sources $I_{101}$, $I_{102}$, $I_{105}$ and $I_{106}$ with the polarity indicated, to the supply line V which is common to each row of trigger circuits and the base electrodes of the transistor $T_{103}$, $T_{104}$ and $T_{107}$ are connected, via similar current sources $I_{103}$, $I_{104}$ and $I_{107}$, to the selection line SE which is common to a row of trigger circuits. It is assumed that the current sources are of such a type that they supply current only if the relevant supply or selection line conveys a positive voltage.

The supply line V always has a positive voltage so that the current sources $I_{101}$, $I_{102}$, $I_{105}$ and $I_{106}$ are always operative. During the rest condition, that is to say if no selection has taken place of the row of trigger circuits to which the circuit shown belongs, the selection line SE is at ground potential or lower so that the current sources $I_{103}$, $I_{104}$ and $I_{107}$ are not operative. The result of this is that in the rest condition the transistors $T_{103}$, $T_{104}$, $T_{105}$, $T_{106}$ and $T_{107}$ will convey no current and consequently the dissipation will be low.

In the rest condition of the trigger circuits, one of the transistors $T_{101}$ and $T_{102}$ will be conductive. Let it be assumed that transistor $T_{101}$ is conductive; the voltage at the base of transistor $T_{101}$ will be equal to $+V_j$, where $V_j$ is the "junction" voltage between the base and emitter of a saturated transistor. The voltage at the base of transistor $T_{102}$ is equal to $V_k$, $V_k$ representing the voltage between the collector and the base of an overdriven transistor. In the case of silicon transistors a usual value for $V_j$ is 0.7 V and $V_k$ usually is between 0 and 0.4 V. This means that the voltage at the base of transistor $T_{102}$ is lower than the voltage at the base of transistor $T_{101}$, namely lower than the junction voltage $V_j$ so that transistor $T_{102}$ is cut off. The collector current for transistor $T_{101}$ thus is supplied by the current source $I_{102}$, while its base current is supplied by the current source $I_{101}$.

If the information has to be read from the trigger circuit or new information has to be written, a positive pulse is supplied to the selection line so that the current sources $I_{103}$, $I_{104}$ and $I_{107}$ become operative. If writing is desirable, one of the write conductors R and S is brought to ground potential. Let it be assumed, for example, that the write conductor R is brought to ground potential. The current which is supplied by the current source $I_{105}$ flows to ground so that transistor $T_{105}$ is cut off. The current which is supplied by the current source $I_{103}$ serves as a base current for transistor $T_{103}$ so that said transistor is conductive. So this transistor draws current from the current source $I_{101}$ so that the transistor $T_{101}$ is cut off. Starting from the write conductor S, which is floating, it is found in a corresponding manner that transistor $T_{102}$ is conductive. The collector current for said transistor $T_{102}$ is supplied by the current source $I_{101}$. So this current source $I_{101}$ supplies both the collector current for transistor $T_{102}$ and for transistor $T_{103}$. After termination of the selection pulse on the selection line SE, the transistor $T_{102}$ remains conductive and transistor $T_{101}$ remains cut off so that the information is stored in the trigger circuit.

It is to be noted that a writing pulse on one of the write conductors R or S has no influence on non-selected trigger circuits. If no selection pulse is present on the selection line SE, the current sources $I_{103}$ and $I_{104}$ actually are not operative so that the transistors $T_{103}$ and $T_{104}$ remain cut off and hence no information can be transmitted from the write conductors to the transistors $T_{101}$ and $T_{102}$.

Upon reading out, the write conductors R and S are floating so that in the presence of the selection pulse the transistors $T_{105}$ and $T_{106}$ are conductive. As a result of this the transistors $T_{103}$ and $T_{104}$ are cut off so that the information in the trigger circuit is not lost. Dependent upon the condition in which the trigger circuit is, transistor $T_{107}$ will be conductive or non-conductive. Let it be assumed again that transistor $T_{101}$ is cut off and transistor $T_{102}$ is conductive, then the current which is supplied by the current source $I_{107}$ which actually is operative as a result of the selection pulse, will serve as a base current for the transistor $T_{107}$ so that said transistor is conductive. The state of said transistor $T_{107}$ is read via the read conductor O. Although only one read conductor is shown it will be obvious that a second read conductor may be present as such and be connected in a manner identical to the first-mentioned conductor to an extra collector electrode of transistor $T_{102}$.

Figure 20:
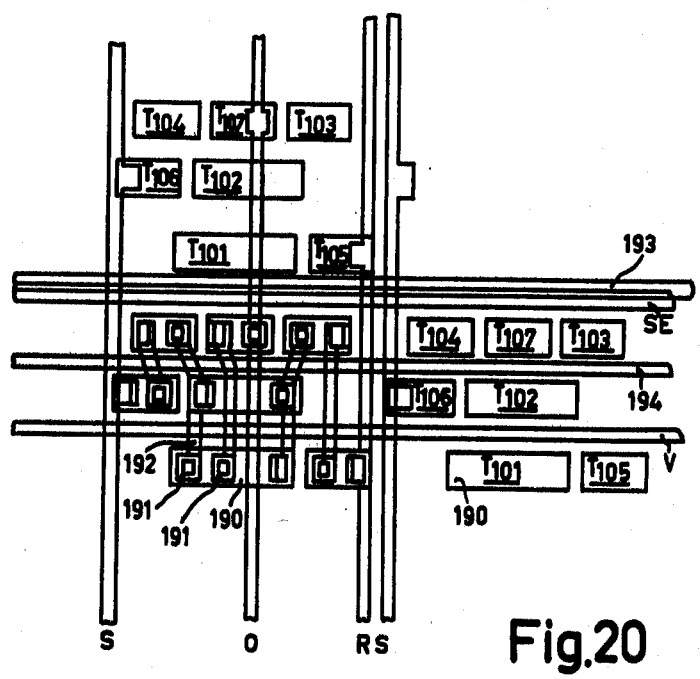
FIG. 20 is a diagrammatic plan view.

FIG. 20 shows a part of the integrated memory circuit in which for clarity only one of the trigger circuits is shown while of the remaining identical trigger circuits of the matrix only two of the adjacent matrix elements are shown diagrammatically.

A number of p-type base zones of the transistors $T_{101}$ to $T_{107}$ of the trigger circuits are provided in a surface layer of an n-type semiconductor body. Each of the said base zones surrounds in the body one, or in the case of the transistor $T_{101}$, two n-type collector zones, while the body constitutes an emitter zone which is common to all transistors. The transistors are connected, by means of a pattern of conductive tracks 192, to trigger circuits according to the diagram shown in FIG. 19 in which each of the trigger circuits of the matrix is connected to conductive tracks R, S and O.

The current sources $I_{101}$ to $I_{107}$ shown in FIG. 19 are realized in the integrated circuit with current injectors. A ribbon-shaped p-type surface zone V which serves as a supply line and on either side of which the base zones 190 of the transistors $T_{102}$, $T_{103}$, $T_{105}$ and $T_{106}$ are arranged, adjoins the semiconductor surface. The surface zone V constitutes the injecting layer of a current injector in which the semiconductor body serves as an intermediate layer and the last-mentioned base zones are zones to be biased to which bias current is supplied in the above-described manner. In a corresponding manner the p-type surface zone SE which serves as a selection line also constitutes a current injector, together with the semiconductor body and the base zones 190 of the transistors $T_{103}$, $T_{104}$ and $T_{107}$. The semiconductor body furthermore comprises two parallel n-type surface zones which extend parallel to the two injecting layers V and SE and which have a higher doping concentration than the adjoining part of the n-type semiconductor body. One of the said zones, the zone 193, adjoins one of the long sides of the zone SE as a result of which the injection of charge carriers from the zone SE takes place mainly in the direction of the transistors $T_{103}$, $T_{104}$ and $T_{107}$ and not in the direction of the transistors $T_{101}$ and $T_{105}$ of adjacent trigger circuits. The other n-type zone 194 extends between the base zones of the transistors $T_{103}$, $T_{104}$ and $T_{107}$ on the one hand and the base zones of the transistors $T_{102}$ and $T_{106}$ on the other hand and prevents parasitic transistor action between the base zones situated on oppositely located sides of the zone 194. If desirable, further n-zones may be provided between the trigger circuits of adjacent columns, which zones extend parallel to the tracks R and S between the injecting layers V and SE. As in the previously described embodiments, all the base zones may also be surrounded separately for the greater part by n+surface zones, or sunken insulating layers may be used instead of more highly doped n-zones.

In the integrated circuit described, the presence of the transistors $T_{105}$ and $T_{106}$ is necessary so as to be able to select the separate memory elements for writing. Because in this circuit the emitters of all the transistors are connected together, the selection of a memory element can be obtained only via base connections. As a result of this, separate transistors are necessary for the selection of rows and columns.

Figure 21:
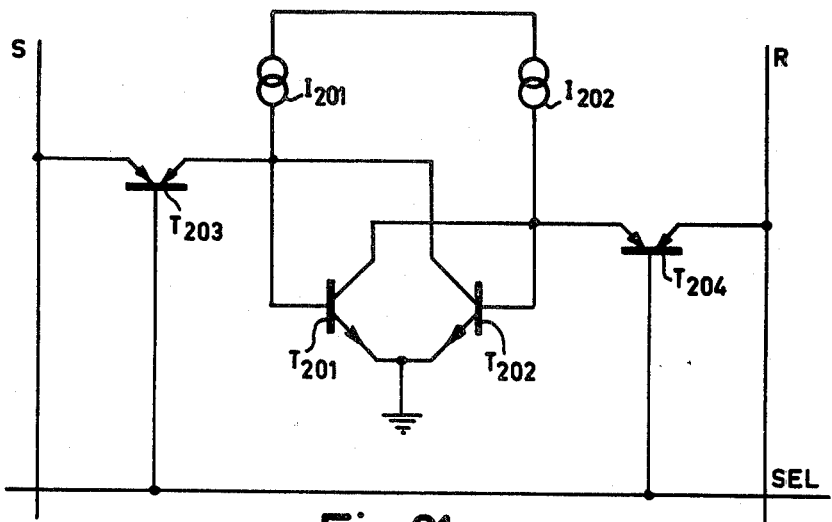

FIG. 21 shows a second memory circuit which may be used in a matrix formed by a number of identical memory circuits arranged in rows and columns. This memory circuit comprises two transistors $T_{201}$ and $T_{202}$ of the n-p-n-type whose emitters are connected to a point of fixed potential, for example earth potential. In order to obtain a bistable element, the base of each of the said transistors is connected to the collector of the other transistor. The supply current for the memory circuit is supplied via the current sources $I_{201}$ and $I_{202}$ connected to the base electrodes of the transistors $T_{201}$ and $T_{202}$.

The writing and reading of information takes place by means of the transistors $T_{203}$ and $T_{204}$ of the p-n-p-type. Via the main current path of the said transistors $T_{203}$ and $T_{204}$, respectively, a connection is produced between the base of transistors $T_{201}$ and $T_{202}$, respectively, amd the read and write conductors S and R, respectively, which are common to a column of memory circuits. The said transistors $T_{203}$ and $T_{204}$ preferably have a symmetric construction because they are operated in both directions in order to fulfil both a reading and a writing function.

Selection of the desirable memory circuit takes place by selection of the relevant row by means of a selection line which is common to a row of memory elements and which is connected to the base electrodes of the transistors $T_{203}$ and $T_{204}$ and by selection of the relevant column by means of the read and write conductors S and R. It will be obvious that both in the selected and in the non-selected condition a suitable value should be chosen for the voltage level of the selection line and the read and write lines. For example, the selection line in the non-selected condition will have to convey such a voltage that the transistors $T_{203}$ and $T_{204}$ are cut off independently of the presence or absence of a write pulse on one of the conductors S or R. In the selected condition, the voltage at the selection line will have to have a value which lies between the voltage values at the base electrodes of the transistors $T_{201}$ and $T_{202}$ occurring in the two stable conditions of the memory circuit. In their non-selected condition, the read and write conductors S and R can, for example, be made floating as a result of which no information can be lost independently of the selected or non-selected condition of the row belonging to the relevant memory element. Upon writing information, the write pulse will have to be sufficiently positive relative to the voltage level of the selected selection line to bring the associated transistor $T_{203}$ or $T_{204}$ in the conductive condition, while for reading information the voltage level of the read conductor will preferably be smaller than the voltage level of the selected selection line.

In order to keep the dissipation of the memory circuit as small as possible and nevertheless to realize a large reading speed, it may be ensured that the supply level of the memory circuit during the stationary condition is low and during reading is switched to a higher level by controlling the currents to be supplied by the current sources $I_{201}$ and $I_{202}$.

The circuit arrangement shown in FIG. 21 is particularly suitable for integration in a semiconductor body. In that case the p-n-p-transistors $T_{203}$ and $T_{204}$ may be constructed as lateral transistors in which in connection with the use in two directions it is of importance that in particular of lateral transistors the electric properties in both directions can be substantially equal. Furthermore, the two current sources $I_{201}$ and $I_{202}$ can simply be realized with a current injector as a result of which also for the integrated construction a comparatively small semiconductor surface area is necessary.

Figure 22:
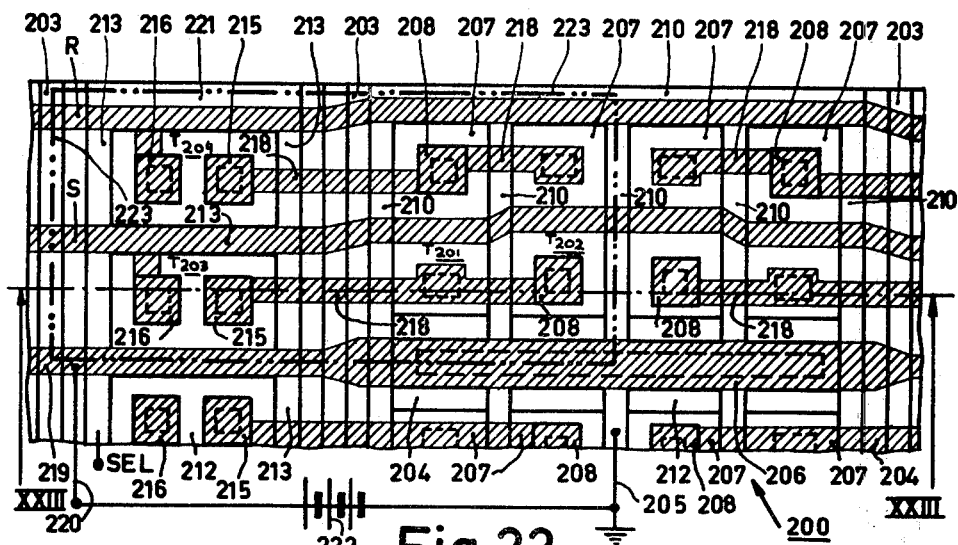
Figure 23:
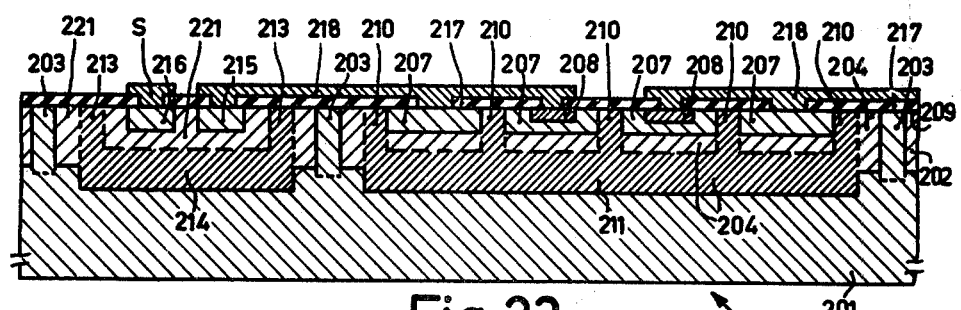
FIG. 23 is a diagrammatic cross-sectional view of said part of the tenth embodiment taken on the line XXIII—XXIII of FIG. 22.

FIGS. 22 and 23 show a part of such an integrated construction of a memory matrix having a current injector according to the invention. The part of said integrated circuit present within the broken line 223 in FIG. 22 comprises a matrix element according to the diagram of FIG. 21. The semiconductor body 200 has a semiconductor substrate 201 which in this case is of p-type conductivity. This p-type substrate 201 comprises an n-type epitaxial layer 202 which is subdivided into islands in a usual manner by means of p-type separation zones 203. All the n-p-n transistors $T_{201}$ and $T_{202}$ of a row of matrix elements are provided in an elongate island 204 which may be connected at the edge of the semiconductor body, for example, to ground by means of a connection 205 which is shown diagrammatically. The island 204 constitutes a common emitter zone for the said n-p-n-transistors. A number of injecting layers is present in said island 204 and only one of them is shown in the Figures, said layers being constituted by p-type surface zones 206. On either side of each injecting layer 206, four n-p-n transistors are present having a p-type base zone 207 and an n-type collector zone 208. The base zones 207 are surrounded at the surface 209 on three sides by a low-ohmic n-type surface zone 210 which extends from the surface 209 in the epitaxial layer and adjoins an n-type buried layer 211 which is present at the boundary of the substrate 201 and the epitaxial layer 202. The zone 210, 211 belonging to the intermediate layer 204 constitutes a low-ohmic assembly having a number of cavities in which current injectors constituted by an injecting layer 206, a high-ohmic part 212 of the intermediate layer 204 and base zones 207 to be biased are present. Moreover, the zone 210, 211 and notably the buried layer 211 serves to reduce the series resistance in the island 204 as a result of which said island during operation is substantially an equipotential plane.

A likewise elongate island 221 in which the lateral p-n-p-transistors $T_{203}$ and $T_{204}$ of the matrix elements are present extends on either side of the elongate islands 204. The islands 221 also have a low-ohmic n-type zone constituted by a surface zone 213 and a buried layer 214 to reduce the series resistance. Actually, these islands 221 constitute a common base zone for the p-n-p-transistors of a row of matrix elements and serve as selection lines SEL. Furthermore the p-n-p-transistors each have a p-type zone 215 which, upon reading information, serves as an emitter zone and, upon writing information, serves as a collector zone and a p-zone 216 which serves as a collector zone and an emitter zone, respectively. These p-n-p transistors are each surrounded by a cup-shaped part of the low-ohmic zone 213, 214 as a result of which substantially no parasitic transistor action can occur between the zones of adjacent p-n-p transistors.

On the surface 209 of the semiconductor body 200 is present an insulating layer 217 on which conductive tracks 218 extend which constitute the internal connections of the matrix elements and which are connected to semiconductor zones of the circuit elements via apertures in the insulating layer which are denoted in broken lines in FIG. 22. The injecting layers 206 are furthermore connected to a conductive track 219 which is provided with a connection 220, while the zones 216 of the transistor $T_{203}$ of a column of matrix elements are connected to a conductive track S and the zones 216 of the transistors $T_{204}$ of a column of matrix elements are connected to a conductive track R.

A source 222 may be connected between the connections 205 and 220 to bias the p-n junctions between the injecting layers 206 and the islands, at the same time intermediate layers 204, in the forward direction. This source 222 may, for example, be controllable so as to be able to provide the n-p-n transistors of the matrix elements with more bias current during the reading of information than in the rest condition and during writing. Such a control of the bias current can also be incorporated per conductive track 209 so that the bias currents can be controlled individually for each two adjacent columns of matrix elements.

The integrated construction described with reference to FIGS. 22 and 23 is particularly compact. A further reduction of the required semiconductor surface area can still be obtained by replacing the n+ zones 210 and 213 by sunken insulating layers which extend from the surface 209 down to the boundary between the epitaxial layer 202 and the substrate 201. In that case, actually, the p-type separation zone 203 and the parts of the n-type zones 210 and 213 present on either side beside it may be replaced by a single sunken insulating layer as a result of which the distance between the n-p-n transistors and the p-n-p-transistors in a column and between the p-n-p-transistors of adjacent columns may become smaller.

It will be obvious from the embodiments described that important advantages are obtained by using the invention. In many cases it is sufficient during the manufacture to use only five masks. Furthermore, a high packing density of the active elements is obtained while resistors are substantially entirely superfluous. The emitters of the transistors used are often connected together directly so that the pattern of conductive tracks is comparatively simple, the collectors being moreover separated from each other automatically. Furthermore, multi-collector transistors can simply be used as a result of which much area and a number of conductive tracks are saved. During operation it is of particular advantage that all the bias currents supplied by means of the current injector vary in the same manner with the voltage across the injecting junction as a result of which the functioning of the integrated circuit is substantially independent of the current level so that a high noise margin is obtained.

It will be obvious that in the circuits described notably those currents are supplied in particular by means of the current injector which have to be present in order that any information containing analogue or digital signal currents or voltages can be handled and, if applicable, written information can be stored. These currents, which might be called prepatory currents, comprise, in components such as logical configurations, trigger circuits and memory elements, all those currents which in the static or in the dynamic condition of the component must be present to cause the component to be ready, that is to say when information is presented at the input, if necessary in combination with a selection signal, to be able to pick up said information, to be able to store written information and/or to be able to inform said information to the output, if desirable after selection.

All the embodiments described can be entirely manufactured by means of methods conventionally used in semiconductor technology, for example epitaxial methods, the provision of buried layers, the local doping with diffusion and/or ion implantation, the provision of patterned insulating, masking and conducting layers, and so on. Furthermore, the integrated circuits described can be assembled in the usual manner in conventional envelopes. For further illustration, the manufacture of the first embodiment, the flip-flop shown in FIGS. 1 to 5, will now be described briefly hereinafter.

Starting material is a silicon substrate $21^a$ (FIG. 2), for example of n-type conductivity and a resistivity between 0.005 and 0.015 ohm cm. On said substrate is provided an n-type epitaxial silicon layer $21^b$ having a resistivity of, for example, between 0.2 and 0.6 ohm cm and a thickness of, for example, approximately 5 μm. In this connection it is to be noted that the current amplification factor $\beta$ of the inverted transistor structure used also depends upon the resistivity of the epitaxial layer. When said factor $\beta$ is approximately 20 with a resistivity of approximately 0.1 ohm cm, the factor $\beta$ is approximately 10 with the same p and n-type diffusions and a resistivity of approximately 0.6 ohm cm, in which it may be noted that with a view to a reliable operation of the circuit in practice a value of 3 or higher is desirable for the factor $\beta$.

A diffusion treatment is then carried out while using a masking layer of, for example, silicon dioxide and with phosphorus as an impurity to obtain the low-ohmic n-type parts $21^c$. The surface concentration in said parts is, for example, $10^{21}$ atoms/ccm. The apertures through which said phosphorus doping is provided in the semiconductor body have a number of parallel extensions in such manner that between two adjacent extensions always sufficient area is present to be able to provide therein a base zone of the desirable size in a subsequent operation. Furthermore, two of those apertures are used in which the extensions of said apertures face each other and are in alignment with each other. The distance between the ends of oppositely located extensions is chosen to be equal to or slightly smaller than the distance which is ultimately desirable between the oppositely located base zones, for example, the zones 5 and 10. The base zones 1 to 10 and the injecting layer 20 may then be provided simultaneously in the conventional manner by diffusion via apertures of the desirable size in a masking layer. In the present example the masking pattern consists of two parallel strips which extend in a direction transverse to the n+ extensions obtained in the meantime and which are present for the greater part in the intermediate space between the oppositely located extensions and each slightly overlap on one side the ends of said extensions or at least touch them. The width of said strips corresponds to the desirable distance between each of the base zones and the injecting layer. Boron, for example, is then indiffused throughout the free surface, for example to a depth of 2.5 μm, the resistance per square being, for example, approximately 150 ohm. Between the two masking strips the injecting layer results while furthermore the base zones 1 to 10 separated from each other are obtained because the surface concentration of said diffusion treatment is insufficient to change the conductivity type of the already present n+ parts 21$^c$. In this manner the base zones automatically adjoin the n+ subzones 21$^c$ directly, they being each enclosed on three sides by a U-shaped n+-type region.

The collector zones 22 to 37 are provided in the usual manner, for example, by local diffusion of phosphorus to a depth of approximately 1.5 μm and having a resistance per square of approximately 5 ohm, contact holes being then etched in the insulating layer and the pattern of conductive tracks 14 being provided, for example, by vapor-depositing and then etching a layer of aluminum.

The width of the injecting layer 20 is, for example, approximately 20 μm. The distance from the injecting layer 20 to each of the base zones is approximately 8 μm. The dimensions of base zone 5 are, for example, approximately 50 μm × 80 μm, while those of the collector zone 33 are 20 μm × 20 μm. The width of the n+ extensions between adjacent base zones may be, for example, 10 μm.

If a sunken insulating layer is used entirely or partly instead of the ohmic subzones 21$^c$, said layer can be obtained, for example, by local oxidation while using a masking layer which may consist, for example, of silicon nitride.

When buried layers are used, as denoted, for example, in FIGS. 6 and 13, these may be, for example, doped with arsenic with a surface concentration of approximately $10^{19}$ atoms/ccm and a resistance per square of approximately 20 ohm. For example, the buried layers 135 in FIG. 13 may also be more highly doped than the base zones 125 to be biased which may be particularly advantageous if said buried layers form part of the emitter zone of the relevant transistor.

It will be obvious that the invention is not restricted to the embodiments described but that many variations are possible to those skilled in the art without departing from the scope of this invention. For example, other semiconductor materials such as germanium and A$^{III}$B$^V$ compounds or combinations of semiconductor materials in which, for example, the substrate consists of a semiconductor material other than the surface layer in which the circuit elements are present may be used. Instead of starting from an n+ substrate 21$^a$ (FIG. 2) on which a lower doped layer 21$^b$ is provided epitaxially, the starting material may also be a low-ohmic substrate which is then provided by outdiffusion of impurities with a lower doped surface layer. Furthermore, the conductivity types in the embodiments described may also be interchanged, in which the polarities of the voltages also have to be interchanged. The integrated circuit may also be provided, for example, with one or more optic signal inputs and/or signal outputs. For example, an incoming optic signal can be converted into an electric signal by means of a photodiode or phototransistor incorporated in the circuit, which electric signal may then serve as an input signal for a further part of the circuit.

As an injecting layer may also be used, for example, a layer which is separated from the intermediate layer of the current injector by a thin layer of insulating material. By using tunnel injection charge carriers can reach the intermediate layer of the current injector as minority charge carriers from the conductive layer through the thin insulating layer.

The current injector may consist, for example, of four or at least of an even number of layers, although a current injector having an odd number of layers is preferably used. Also in the case of current injectors having four or more layers, apart from the zone to be biased preferably at most one further zone of the relevant circuit element coincides with a layer of the current injector.

Furthermore, in a current injector having, for example, seven layers, the third and the fifth layers may be used independently of each other for controlling the bias current to be supplied to the zone to be biased. The third and fifth layers of the current injector may then be considered, for example, as the two inputs of an AND gate of which the zone to be biased forms an output.

Zones of circuit elements other than the bipolar transistors shown, for example, zones of diodes and field effect transistors, can also be provided with bias current by means of the current injector in a corresponding manner. Moreover, for example, gate electrodes of field effect transistors, in particular of field effect transistors having a low threshold voltage, can be controlled by means of the current injector.

When using a lateral current injector as in FIG. 1, the ratio between the bias currents supplied to various zones to be biased is proportional to the ratio between the lengths of the parts facing the injecting layer 20 of the p-n junctions between the relevant base zones to be biased and the intermediate layer 21. In the example shown the available bias current is equally large for each base zone. Other ratios can simply be realized by means of differences in length in the structure. In this way, for instance, the first transistor on the chip of an integrated circuit and/or the last one may be given a relatively large bias current to increase the noise margin at the input(s) and/or the output(s) of the chip. Another measure to increase the noise margin where necessary is to use a higher value of the current gain β. Such higher circuit gain may be obtained by giving the transistor(s) in question a relative large area collector region. Such relatively large collector region may have dimensions of, for example, 40 μm × 20 μm instead of 20 μm × 20 μm as used in the embodiment of FIG. 1. This enlarged collector region may be nested in a relatively broad base region of 70 μm instead of the 50 μm mentioned with reference to FIG. 1.

Furthermore, instead of by doping, one or more layers of the current injector can be induced in the semiconductor body, for example, with surface states and/or charges in the insulating layer and/or by means of an electrode layer present on the insulating layer. In the five-layer current injector described, for example, the third layer may be formed by an induced inversion layer. One or more layers of the current injector may also consist of a combination of a part obtained by doping and an induced part cohering therewith. For example, when the distance between an injecting junction in the current injector obtained by doping and a collecting junction in the current injector obtained by doping is comparatively large so that in said part of the current injector no or a small current transfer takes place, said distance can be reduced by extending one or both layers at the surface on a side facing the other layer by an inversion layer.

When the described induced inverted layers are used, and in particular if they are obtained by means of an insulating electrode layer, the bias current to be supplied to the zone to be biased may also be controlled by the voltage on the electrode layer.

It will be obvious from the examples described that the integrated circuits have a new, compact structure and can often be manufactured with a simplified method. Said new structure is preferably characterized by the presence of a semiconductor region of one conductivity type which adjoins a surface and in which an elongate strip-shaped surface zone of the opposite conductivity type extends which forms part, for example, of a system of channels or of a grid and which forms a p-n junction with the adjoining region, several juxtaposed surface zones of the opposite conductivity type which are separated from each other and from the strip-shaped zone adjoining the surface on at least one of the long sides of said strip-shaped zone, said surface zones constituting zones to be biased of circuit elements of the circuit and in particular base zones to be biased of bipolar transistors, the region and the strip-shaped surface zone being each provided with a connection to bias the said p-n junction in the forward direction to inject minority charge carriers into the region, the zones to be biased receiving bias current by collection of minority charge carriers from the region via the p-n junctions which said region forms with the zones to be biased.

What is claimed is:

1. An integrated semiconductor memory comprising a plurality of groups of first, second, and third transistors each having emitter, base and collector, first and second transistors in each group being connected to form a plurality of cross-coupled trigger flip-flop circuits, said plurality of trigger circuits being arranged in rows and columns, the third transistors being complementary to the first and second transistors, a first read-write line commonly coupled to a column of trigger circuits, means connecting the first read-write line through the emitter-collector path of the third transistor to the base of the first transistor in that group, means for providing a circuit path from the emitters of the first and second transistors to a point of reference potential, a current injector coupled to the base zones of the first and second transistors and capable when forward biased of injecting carriers from a region outside of the first and second transistors and causing collection of the same or corresponding carriers by said base zones biasing the first and second transistors into operative condition, and a voltage supply line connected to the current injector.

2. A memory as claimed in claim 1 wherein the plural groups each include a fourth transistor having emitter, base and collector and complementary to the first and second transistors, and further comprising a second read-write line commonly coupled to the column of trigger circuits, and means connecting the second read-write line through the emitter-collector path of the fourth transistor to the base of the second transistor in that group.

3. A memory as claimed in claim 2 and further comprising a common selection line for a row of trigger circuits, and means connecting the selection line to the base zones of the third and fourth transistors of a row of trigger circuits.

4. A memory as claimed in claim 2, wherein the current injector comprises a first layer and a second intermediate layer forming a P-N junction which when forward biased injects carriers collected by the base zones of the first and second transistors, said intermediate layer also constituting a common emitter zone for all the first and second transistors in a row.

5. A memory as claimed in claim 3, wherein the base zones connected to the selection line are constituted by a common region of a semiconductor body.

6. A memory as claimed in claim 4, wherein all of the groups are arrayed in a common semiconductor body.

7. An integrated semiconductor memory comprising a plurality of groups of first, second, third and fourth transistors each having emitter, base and collector, first and second transistors in each group being connected to form a plurality of cross-coupled trigger flip-flop circuits, said plurality of trigger circuits being arranged in rows and columns, means connecting the collector of the third and fourth transistors in each group to the bases respectively of the first and second transistors in the same group, first and second write lines commonly coupled to a column of trigger circuits, means for connecting the emitters of the first, second, third and fourth transistors to a point of reference potential, first and second current injectors each comprising means responsive to a forward bias for injecting carriers which when collected by a transistor zone will bias said zone into operation, a voltage supply line connected to the first current injector, means for coupling the first current injector to the base zones of the first and second transistors of all of the trigger circuits, a selection line connected to the second current injector, and means for coupling the second current injector to the base zones of the third and fourth transistors of a row of trigger circuits.

8. An integrated semiconductor memory as claimed in claim 7, wherein each group further includes fifth and sixth transistors each having emitter, base and collector, means for connecting the emitters of the fifth and sixth transistors to the point of reference potential, means connecting the bases of the third and fourth transistors to the collectors of the fifth and sixth transistors, respectively, means connecting the bases of the fifth and sixth transistors to the first and second write lines, respectively, and means coupling the bases of the fifth and sixth transistors to the first current injector.

* * * * *